(12) United States Patent
Yoneda et al.

(10) Patent No.: US 12,080,736 B2
(45) Date of Patent: Sep. 3, 2024

(54) IMAGING DEVICE AND ELECTRONIC DEVICE

(71) Applicant: Semiconductor Energy Laboratory Co., Ltd., Atsugi (JP)

(72) Inventors: Seiichi Yoneda, Isehara (JP); Yusuke Negoro, Kaizuka (JP); Takayuki Ikeda, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 384 days.

(21) Appl. No.: 17/633,242

(22) PCT Filed: Aug. 7, 2020

(86) PCT No.: PCT/IB2020/057459
§ 371 (c)(1),
(2) Date: Feb. 7, 2022

(87) PCT Pub. No.: WO2021/033065
PCT Pub. Date: Feb. 25, 2021

(65) Prior Publication Data
US 2022/0359592 A1 Nov. 10, 2022

(30) Foreign Application Priority Data

Aug. 22, 2019 (JP) ................................. 2019-151829
Nov. 8, 2019 (JP) ................................. 2019-203331
(Continued)

(51) Int. Cl.
*H01L 27/14* (2006.01)
*H01L 27/146* (2006.01)

(52) U.S. Cl.
CPC .. *H01L 27/14616* (2013.01); *H01L 27/14649* (2013.01)

(58) Field of Classification Search
CPC ......... H01L 27/14609; H01L 27/14612; H01L 27/14616; H01L 27/14641; H01L 27/14649
See application file for complete search history.

(56) References Cited

U.S. PATENT DOCUMENTS 8,378,391 B2  2/2013  Koyama et al.
9,773,832 B2  9/2017  Kurokawa
(Continued)

FOREIGN PATENT DOCUMENTS

CN  110651468 A  1/2020
CN  110832845 A  2/2020
(Continued)

OTHER PUBLICATIONS

International Search Report (Application No. PCT/IB2020/057459) Dated Nov. 17, 2020.
(Continued)

*Primary Examiner* — Kevin K Pyo
(74) *Attorney, Agent, or Firm* — Eric J. Robinson; Robinson Intellectual Property Law Office, P.C.

(57) ABSTRACT

An imaging device that has an image processing function and is capable of a high-speed operation is provided. The imaging device, which has an additional function such as image processing, can retain analog data obtained by an image capturing operation in a pixel and extract data obtained by multiplying the analog data by a predetermined weight coefficient. In the imaging device, some of potentials used for an arithmetic operation in pixels are generated by redistribution of charge with which wirings are charged. This enables an arithmetic operation to be performed at high speed with low power consumption, compared with the case where the potentials are supplied from another circuit to the pixels.

8 Claims, 31 Drawing Sheets

(30) Foreign Application Priority Data

Jan. 21, 2020 (JP) ................................ 2020-007843
Jun. 26, 2020 (JP) ................................ 2020-110652

(56) References Cited

U.S. PATENT DOCUMENTS

| | | |
|---|---|---|
| 9,870,827 B2 | 1/2018 | Nakagawa et al. |
| 10,074,687 B2 | 9/2018 | Kurokawa |
| 10,389,961 B2 | 8/2019 | Kurokawa |
| 10,600,839 B2 | 3/2020 | Kurokawa |
| 10,951,850 B2 | 3/2021 | Yamamoto et al. |
| 10,964,743 B2 | 3/2021 | Kurokawa |
| 11,101,302 B2 | 8/2021 | Ikeda et al. |
| 2016/0172410 A1 | 6/2016 | Kurokawa |
| 2016/0301890 A1* | 10/2016 | Kurokawa ............. H04N 25/75 |
| 2018/0039882 A1 | 2/2018 | Ikeda et al. |
| 2020/0382730 A1 | 12/2020 | Kurokawa et al. |
| 2021/0233952 A1 | 7/2021 | Kurokawa |
| 2021/0384239 A1 | 12/2021 | Ikeda et al. |
| 2022/0238582 A1* | 7/2022 | Yoneda ............. H01L 27/14616 |

FOREIGN PATENT DOCUMENTS

| | | |
|---|---|---|
| EP | 3654635 A | 5/2020 |
| JP | 2011-119711 A | 6/2011 |
| JP | 2016-123087 A | 7/2016 |
| KR | 2020-0012917 A | 2/2020 |
| KR | 2020-0028967 A | 3/2020 |
| WO | WO-2018/215882 | 11/2018 |
| WO | WO-2019/012369 | 1/2019 |

OTHER PUBLICATIONS

Written Opinion (Application No. PCT/IB2020/057459) Dated Nov. 17, 2020.

* cited by examiner

FIG. 5A

| -1 | -1 | -1 |
|----|----|----|
| -1 | 8  | -1 |
| -1 | -1 | -1 |

FIG. 5B

| -1 | -1 | -1 |
|----|----|----|
| 0  | 0  | 0  |
| 1  | 1  | 1  |

FIG. 5C

| -1 | -2 | -1 |
|----|----|----|
| 0  | 0  | 0  |
| 1  | 2  | 1  |

FIG. 7A  ΔW  =  Σ ΔW/N  =  Laplacian filter × 1/9

$$\Delta W = \begin{bmatrix} 0 & 0 & 0 \\ 0 & 1 & 0 \\ 0 & 0 & 0 \end{bmatrix}$$

$$\Sigma \Delta W/N = \begin{bmatrix} 1/9 & 1/9 & 1/9 \\ 1/9 & 1/9 & 1/9 \\ 1/9 & 1/9 & 1/9 \end{bmatrix}$$

Laplacian filter
$$\begin{bmatrix} -1 & -1 & -1 \\ -1 & 8 & -1 \\ -1 & -1 & -1 \end{bmatrix} \times 1/9$$

FIG. 7B  ΔW  =  Σ ΔW/N  =  Prewitt filter $$\Delta W = \begin{bmatrix} 0 & 1 & 2 \\ 0 & 1 & 2 \\ 0 & 1 & 2 \end{bmatrix}$$

$$\Sigma \Delta W/N = \begin{bmatrix} 1 & 1 & 1 \\ 1 & 1 & 1 \\ 1 & 1 & 1 \end{bmatrix}$$

Prewitt filter
$$\begin{bmatrix} -1 & 0 & 1 \\ -1 & 0 & 1 \\ -1 & 0 & 1 \end{bmatrix}$$

$a = x_1 w_1 + x_2 w_2 + b$

FIG. 24A1
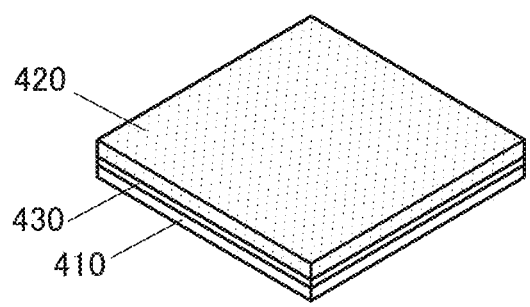
FIG. 24B1
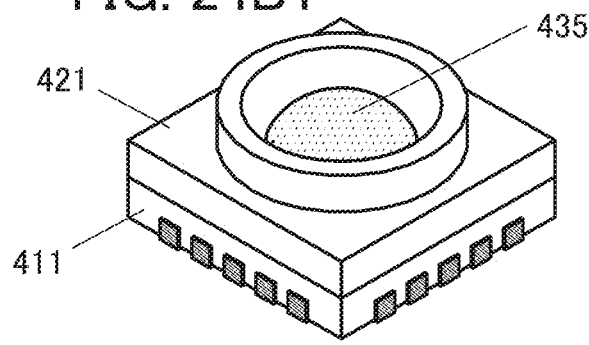
FIG. 24A2
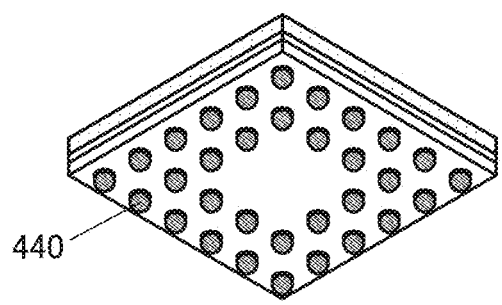
FIG. 24B2
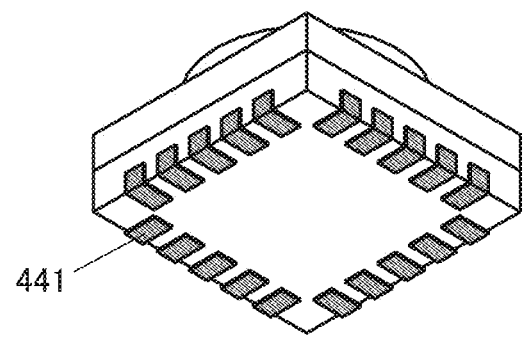
FIG. 24A3
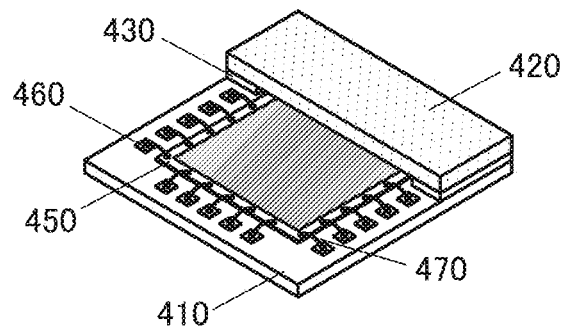
FIG. 24B3
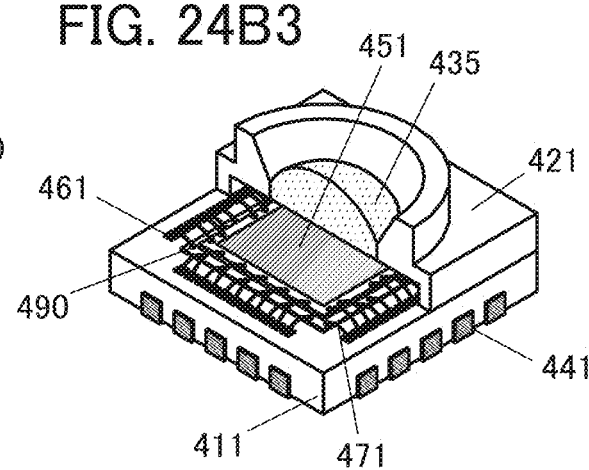

FIG. 31A
FIG. 31B
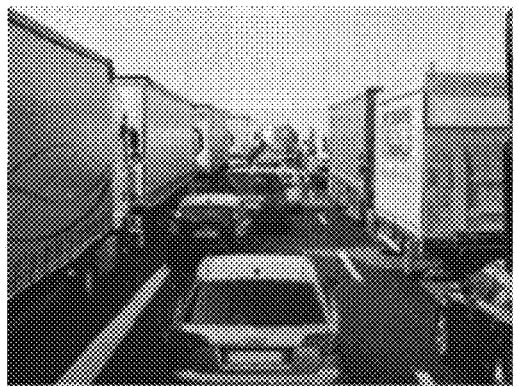
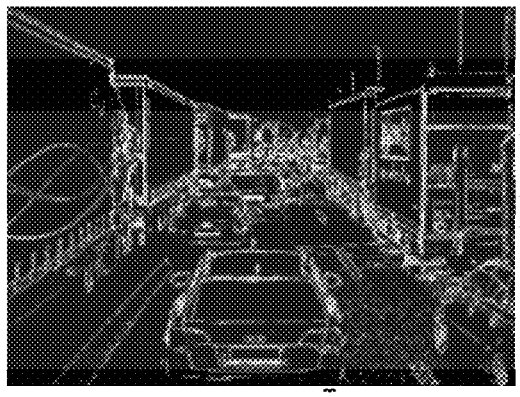

IMAGING DEVICE AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display device, a liquid crystal display device, a light-emitting device, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

A technique which adds an arithmetic function to an imaging device is disclosed in Patent Document 2.

REFERENCE

Patent Document

[Patent Document 1] Japanese Published Patent Application No. 2011-119711
[Patent Document 2] Japanese Published Patent Application No. 2016-123087

SUMMARY OF THE INVENTION

Problems to be Solved by the Invention

With the technological development, a high-quality image can be easily captured by an imaging device provided with a solid-state imaging element such as a CMOS image sensor. In the next generation, an imaging device is required to be equipped with more intelligent functions.

Image data (analog data) obtained by an imaging device is converted into digital data and taken out to the outside, and then image processing is performed as necessary. If the processing can be carried out in the imaging device, higher-speed communication with an external device is possible, improving user's convenience. Furthermore, load and power consumption of a peripheral device or the like can be reduced. Moreover, if complicated data processing is performed in an analog data state, time required for data conversion can be shortened.

Thus, an object of one embodiment of the present invention is to provide an imaging device capable of image processing. Another object is to provide an imaging device capable of a high-speed operation. Another object is to provide an imaging device with low power consumption. Another object is to provide a highly reliable imaging device. Another object is to provide a novel imaging device or the like. Another object is to provide a method for driving the above-described imaging device. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to an imaging device that has an image processing function and is capable of a high-speed operation.

One embodiment of the present invention is an imaging device which includes a first pixel; a second pixel; and a first transistor. The first pixel and the second pixel each include a second transistor and a capacitor. One of a source and a drain of the second transistor is electrically connected to one electrode of the capacitor. The one electrode of the capacitor included in the first pixel is electrically connected to one of a source and a drain of the first transistor. The one electrode of the capacitor included in the second pixel is electrically connected to the other of the source and the drain of the first transistor.

The first pixel and the second pixel can each further include a third transistor, a fourth transistor, a fifth transistor, a sixth transistor, and a photoelectric conversion device. The other electrode of the capacitor can be electrically connected to a gate of the third transistor, one of a source and a drain of the fourth transistor, and one of a source and a drain of the fifth transistor. One of a source and a drain of the third transistor can be electrically connected to one of a source and a drain of the sixth transistor. The other of the source and the drain of the fifth transistor can be electrically connected to one electrode of the photoelectric conversion device.

The photoelectric conversion device can include a photoelectric conversion layer having sensitivity to infrared light. A compound semiconductor may be used in the photoelectric conversion layer.

The imaging device may further include a first circuit. The first circuit may have a function of outputting a first potential or a second potential. The first circuit may be electrically connected to each of the other of the source and the drain of the second transistor included in the first pixel and the other of the source and the drain of the second transistor included in the second pixel.

The imaging device may further include a second circuit. The second circuit may have a function of a correlated double sampling circuit. The second circuit may be electrically connected to each of the other of the source and the drain of the sixth transistor included in the first pixel and the other of the source and the drain of the sixth transistor included in the second pixel.

One or more of the first transistor to the sixth transistor preferably include a metal oxide in a channel formation region, and the metal oxide preferably contains In, Zn, and M (M is one or more of Al, Ti, Ga, Ge, Sn, Y, Zr, La, Ce, Nd, and Hf).

Another embodiment of the present invention is an imaging device which includes a pixel block, a first circuit, and a second circuit. The pixel block includes n (n is a natural number greater than or equal to 2) pixels. The first circuit has a function of supplying any of two or more potentials selected from a first potential, a second potential, and a third potential to each of the n pixels. Each of the n pixels has a function of obtaining first image data. Each of the n pixels has a function of generating second image data by adding any of the first potential, the second potential, and the third potential to the first image data. The pixel block has, targeted at m (m is a natural number of 1 to n) pixels selected from the n pixels, a function of generating a fourth potential by adding all the first potential, the second potential, or the third potential supplied from the first circuit to each of them pixels and performing division by the n. Each of the n pixels has a function of generating third image data by adding the fourth potential to the first image data. The second circuit has a function of generating fifth image data corresponding to a difference between a sum of the second image data output by the n pixels and a sum of the third image data output by the n pixels.

Effect of the Invention

With one embodiment of the present invention, an imaging device capable of image processing can be provided. An imaging device capable of a high-speed operation can be provided. An imaging device with low power consumption can be provided. A highly reliable imaging device can be provided. A novel imaging device or the like can be provided. A method for driving the above-described imaging device can be provided. A novel semiconductor device or the like can be provided.

BRIEF DESCRIPTION OF THE DRAWINGS

FIG. 5A to FIG. 5C are diagrams illustrating filters.
FIG. 7A and FIG. 7B are diagrams illustrating filters.

FIG. 24A1 to FIG. 24A3 and FIG. 24B1 to FIG. 24B3 are perspective views of a package and a module in which an imaging device is placed.
FIG. 31A is a photograph and FIG. 31B is data.

MODE FOR CARRYING OUT THE INVENTION

Figure 1:
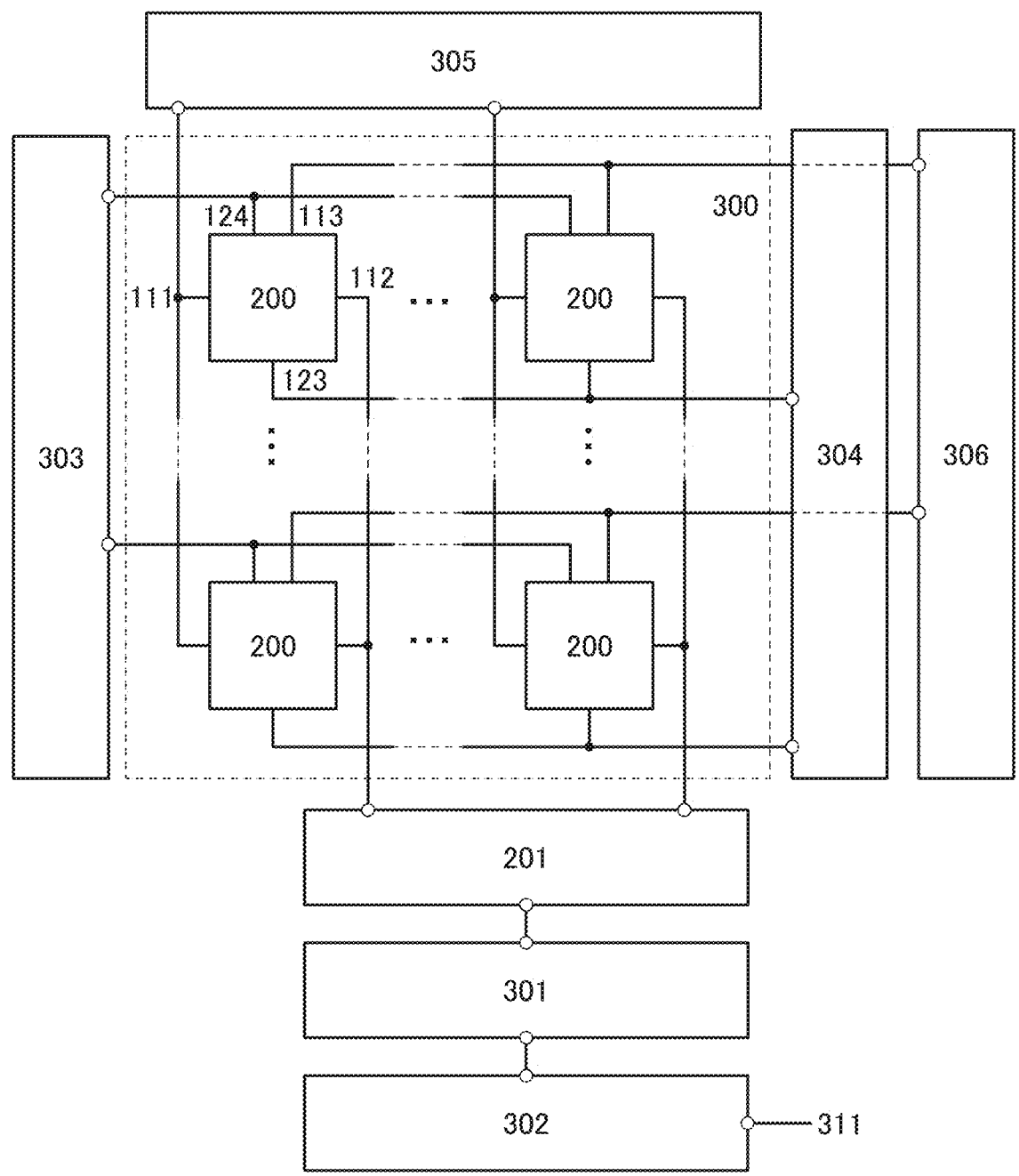
FIG. 1 is a block diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of the embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through one conductor or a plurality of conductors. In this specification, even such a structure is included in direct connection.

Embodiment 1

In this embodiment, an imaging device of one embodiment of the present invention is described with reference to drawings.

One embodiment of the present invention is an imaging device having an additional function such as image processing. The imaging device can retain analog data (image data)

obtained by an image capturing operation in a pixel and extract data obtained by multiplying the analog data by a predetermined weight coefficient.

When the data is taken in a neural network or the like, processing such as image recognition can be performed. Since enormous volumes of image data can be retained in pixels in the state of analog data, processing can be performed efficiently.

In the imaging device of one embodiment of the present invention, some of potentials used for an arithmetic operation in pixels are generated by redistribution of charge with which wirings are charged. This enables an arithmetic operation to be performed at high speed with low power consumption, compared with the case where the potentials are supplied from another circuit to the pixels.

<Imaging Device>

FIG. 1 is a block diagram illustrating the imaging device of one embodiment of the present invention. The imaging device includes a pixel array 300, a circuit 201, a circuit 301, a circuit 302, a circuit 303, a circuit 304, a circuit 305, and a circuit 306. Note that each of the structures of the circuit 201 and the circuit 301 to the circuit 306 is not limited to a single circuit and may consist of a combination of a plurality of circuits. Furthermore, any two or more of the circuits described above may be combined. Moreover, a circuit other than the above circuits may be connected.

The pixel array 300 has an image capturing function and an arithmetic function. The circuits 201 and 301 each have an arithmetic function. The circuit 302 has an arithmetic function or a data conversion function. The circuits 303, 304, and 306 each have a selection function. The circuit 305 has a function of supplying a potential for a product-sum operation to a pixel. As a circuit having a selection function, a shift register, a decoder, or the like can be used. Note that the circuits 301 and 302 may be provided outside.

Figure 2:
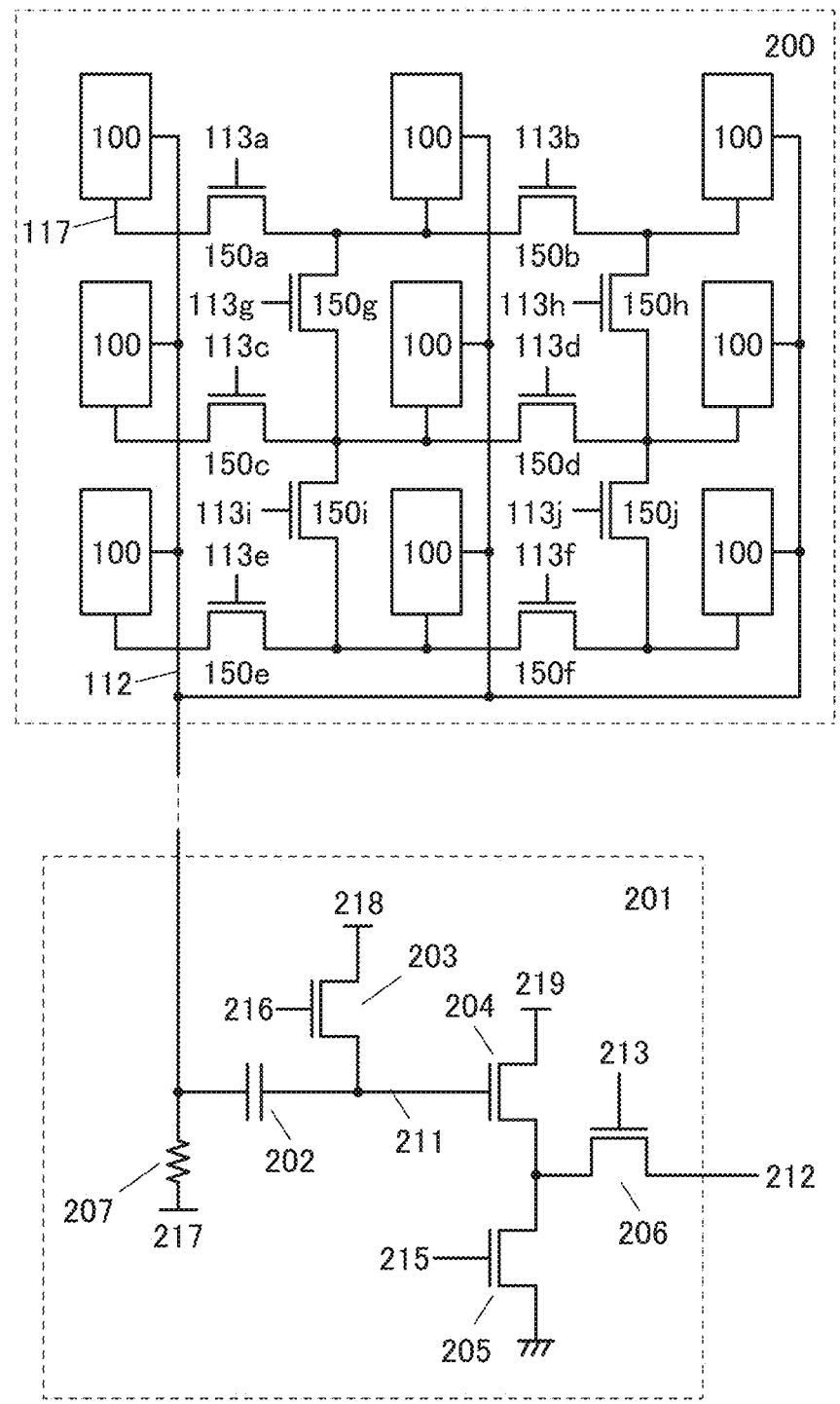
FIG. 2 is a diagram illustrating a pixel block 200 and a circuit 201.

The pixel array 300 includes a plurality of pixel blocks 200. As illustrated in FIG. 2, the pixel block 200 includes a plurality of pixels 100 arranged in a matrix, and each of the pixels 100 is electrically connected to the circuit 201 through wirings 112. Note that the circuit 201 can also be provided in the pixel block 200.

Furthermore, the pixel 100 is electrically connected to an adjacent pixel 100 through a transistor 150 (transistors 150a to 150j). The functions of the transistors 150 are described later.

The pixels 100 can obtain image data and generate data obtained by adding the image data and a weight coefficient. Note that the number of pixels included in the pixel block 200 is 3×3 in an example illustrated in FIG. 2 but is not limited to this. For example, the number of pixels can be 2×2, 4×4, or the like. Alternatively, the number of pixels in the horizontal direction and the number of pixels in the vertical direction may differ from each other.

Furthermore, some pixels may be shared by adjacent pixel blocks.

The pixel block 200 and the circuit 201 can operate as a product-sum operation circuit.

<Pixel Circuit>

Figure 3A:
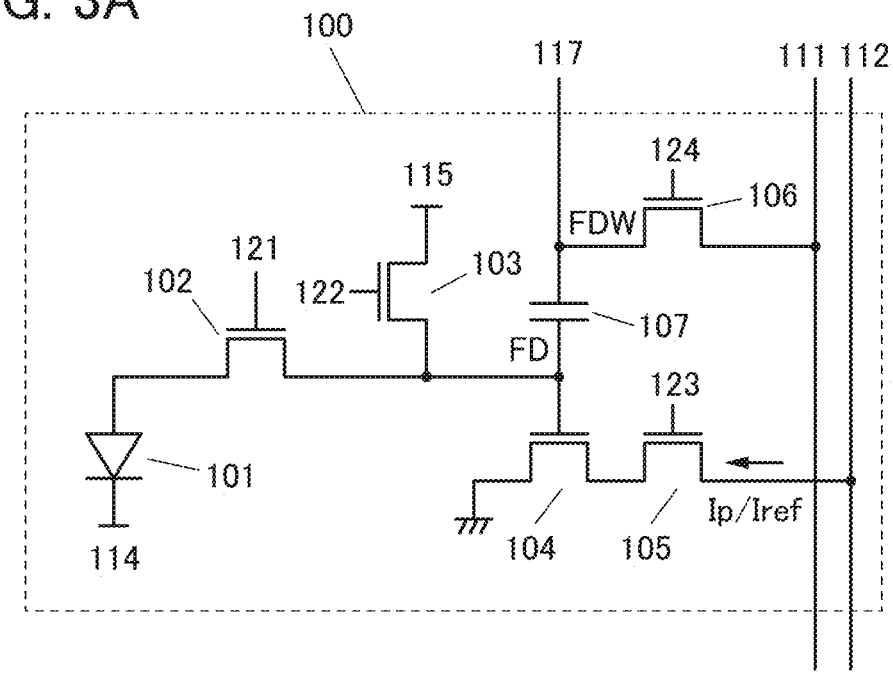
FIG. 3A and FIG. 3B are diagrams illustrating a pixel 100.

As illustrated in FIG. 3A, the pixel 100 can include a photoelectric conversion device 101, a transistor 102, a transistor 103, a transistor 104, a transistor 105, a transistor 106, and a capacitor 107.

One electrode of the photoelectric conversion device 101 is electrically connected to one of a source and a drain of the transistor 102. The other of the source and the drain of the transistor 102 is electrically connected to one of a source and a drain of the transistor 103, a gate of the transistor 104, and one electrode of the capacitor 107. One of a source and a drain of the transistor 104 is electrically connected to one of a source and a drain of the transistor 105. The other electrode of the capacitor 107 is electrically connected to one of a source and a drain of the transistor 106.

The other electrode of the photoelectric conversion device 101 is electrically connected to a wiring 114. The other of the source and the drain of the transistor 103 is electrically connected to a wiring 115. The other of the source and the drain of the transistor 105 is electrically connected to the wiring 112. The other of the source and the drain of the transistor 104 is electrically connected to a GND wiring or the like. The other of the source and the drain of the transistor 106 is electrically connected to a wiring 111. The other electrode of the capacitor 107 is electrically connected to a wiring 117.

A gate of the transistor 102 is electrically connected to a wiring 121. A gate of the transistor 103 is electrically connected to a wiring 122. A gate of the transistor 105 is electrically connected to a wiring 123. A gate of the transistor 106 is electrically connected to a wiring 124.

Here, a point (wiring) where the other of the source and the drain of the transistor 102, the one of the source and the drain of the transistor 103, the one electrode of the capacitor 107, and the gate of the transistor 104 are electrically connected is referred to as a node FD. Furthermore, a point (wiring) where the other electrode of the capacitor 107 and the one of the source and the drain of the transistor 106 are electrically connected is referred to as a node FDW.

The wirings 114 and 115 can each have a function of a power supply line. For example, the wiring 114 can function as a high potential power supply line, and the wiring 115 can function as a low potential power supply line. The wirings 121, 122, 123, 124, and 124 can function as signal lines that control the conduction of the respective transistors. The wiring 111 can function as a wiring for supplying a potential corresponding to a weight coefficient to the pixel 100. The wiring 112 can function as a wiring that electrically connects the pixel 100 and the circuit 201. The wiring 117 can function as a wiring that electrically connects the other electrode of the capacitor 107 of the pixel 100 and the other electrode of the capacitor 107 of another pixel 100 through the transistor 150 (see FIG. 2).

Note that an amplifier circuit or a gain control circuit may be electrically connected to the wiring 112.

As the photoelectric conversion device 101, a photodiode can be used. There is no limitation on the kind of photodiode, and a Si photodiode containing silicon in a photoelectric conversion layer, an organic photodiode including an organic photoconductive film in a photoelectric conversion layer, or the like can be used. In order to increase the light detection sensitivity under low illuminance conditions, an avalanche photodiode is preferably used.

The transistor 102 can have a function of controlling the potential of the node FD. The transistor 103 can have a function of initializing the potential of the node FD. The transistor 104 can have a function of controlling a current fed by the circuit 201 in accordance with the potential of the node FD. The transistor 105 can have a function of selecting a pixel. The transistor 106 can have a function of supplying the potential corresponding to the weight coefficient to the node FDW.

Figure 3B:
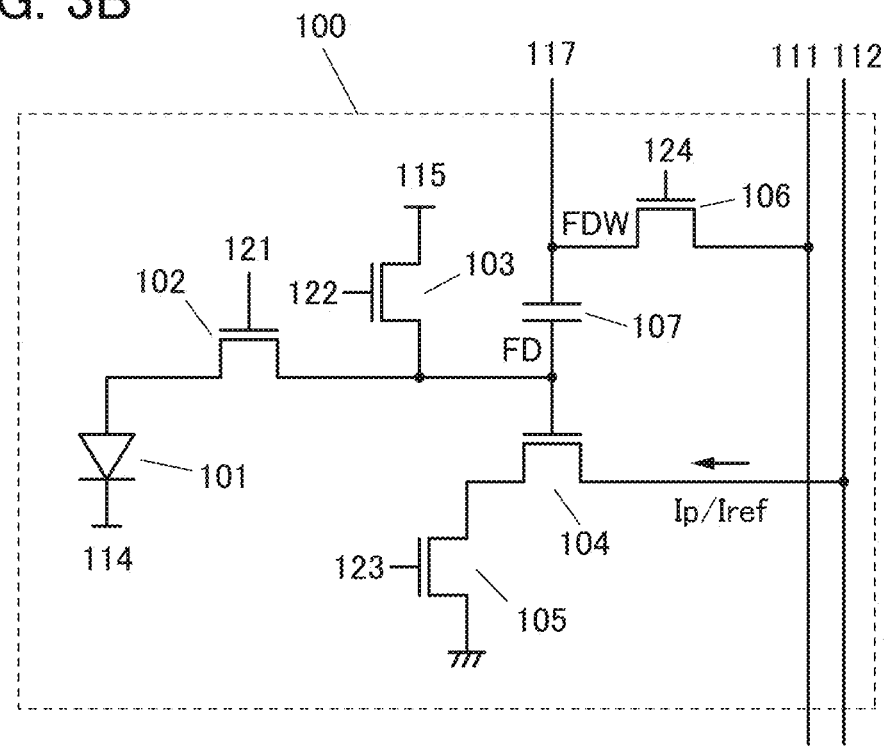

Note that as illustrated in FIG. 3B, the one of the source and the drain of the transistor 104 may be electrically connected to the one of the source and the drain of the transistor 105, the other of the source and the drain of the transistor 104 may be connected to the wiring 112, and the other of the source and the drain of the transistor 105 may be electrically connected to a GND wiring or the like.

Figure 4A:
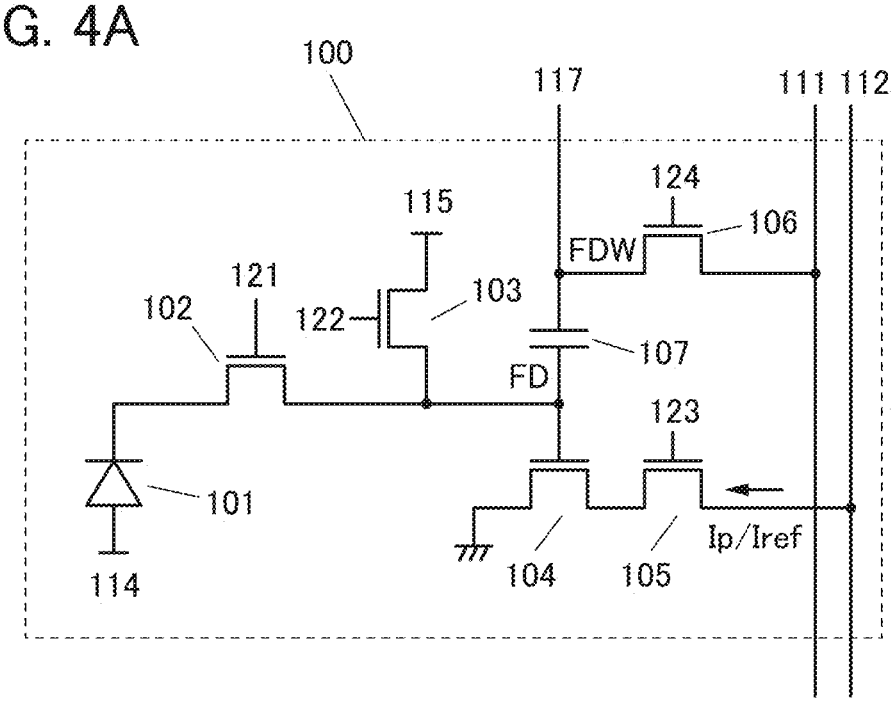
FIG. 4A and FIG. 4B are diagrams illustrating the pixel 100.
Figure 4B:
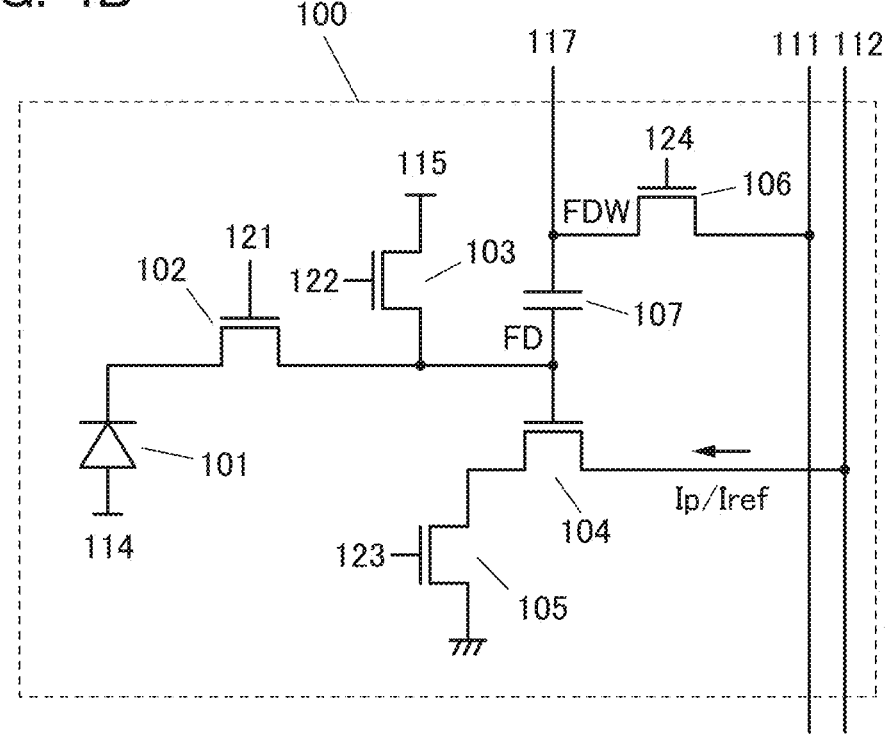

As illustrated in FIG. 4A and FIG. 4B, the connection direction of the photoelectric conversion device 101 may be reversed. In that case, the wiring 114 functions as a low potential power supply line and the wiring 115 functions as a high potential power supply line.

In the case where an avalanche photodiode is used as the photoelectric conversion device 101, a high voltage is sometimes applied and thus a transistor with a high withstand voltage is preferably used as a transistor connected to the photoelectric conversion device 101. As the transistor with a high withstand voltage, a transistor using a metal oxide in its channel formation region (hereinafter, an OS transistor) or the like can be used, for example. Specifically, an OS transistor is preferably used as the transistor 102.

The OS transistor also has a feature of an extremely low off-state current. When OS transistors are used as the transistors 102, 103, and 106, the charge retention period of the node FD and the node FDW can be lengthened greatly. Therefore, a global shutter mode in which a charge accumulation operation is performed in all the pixels at the same time can be used without complicating the circuit structure and operation method. Furthermore, while image data is retained at the node FD, an arithmetic operation using the image data can be performed a plurality of times.

Meanwhile, it is sometimes desired that the transistor 104 have excellent amplifying characteristics. A transistor having a high mobility capable of a high-speed operation is sometimes preferably used as the transistor 106. Accordingly, transistors using silicon in their channel formation regions (hereinafter, Si transistors) may be used as the transistors 104 and 106.

Note that without limitation to the above, an OS transistor and a Si transistor may be used in combination. Alternatively, all the transistors may be OS transistors. Alternatively, all the transistors may be Si transistors. Examples of the Si transistor include a transistor including amorphous silicon and a transistor including crystalline silicon (microcrystalline silicon, low-temperature polysilicon, or single crystal silicon).

The potential of the node FD in the pixel 100 is determined by the potential obtained by adding a reset potential supplied from the wiring 115 and a potential (image data) generated by photoelectric conversion by the photoelectric conversion device 101. Moreover, the potential of the node FD in the pixel 100 is determined by capacitive coupling of the potential corresponding to a weight coefficient supplied from the wiring 111. Thus, a current corresponding to data in which a predetermined weight coefficient is added to the image data can flow through the transistor 105.

Note that the circuit structures of the pixel 100 described above are examples, and the photoelectric conversion operation can be performed with other circuit structures as well.

<Circuit 201>

As illustrated in FIG. 2, the pixels 100 are electrically connected to each other through the wirings 112. The circuit 201 can perform an arithmetic operation using the sum of the currents flowing through the transistors 104 of the pixels 100.

The circuit 201 includes a capacitor 202, a transistor 203, a transistor 204, a transistor 205, a transistor 206, and a resistor 207.

One electrode of the capacitor 202 is electrically connected to one of a source and a drain of the transistor 203. The one of the source and the drain of the transistor 203 is electrically connected to a gate of the transistor 204. One of a source and a drain of the transistor 204 is electrically connected to one of a source and a drain of the transistor 205. The one of the source and the drain of the transistor 205 is electrically connected to one of a source and a drain of the transistor 206. One electrode of the resistor 207 is electrically connected to the other electrode of the capacitor 202.

The other electrode of the capacitor 202 is electrically connected to the wiring 112. The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 212. The other electrode of the resistor 207 is electrically connected to a wiring 217. A gate of the transistor 203 is electrically connected to a wiring 216. A gate of the transistor 205 is electrically connected to a wiring 215. A gate of the transistor 206 is electrically connected to a wiring 213.

The wirings 217, 218, and 219 can each have a function of a power supply line. For example, the wiring 218 can have a function of a wiring for supplying a potential dedicated for a reading operation. The wirings 217 and 219 can function as high potential power supply lines. The wirings 213, 215, and 216 can function as signal lines that control the conduction of the respective transistors. The wiring 212 is an output line and can be electrically connected to the circuit 301 illustrated in FIG. 1, for example.

The transistor 203 can have a function of resetting the potential of a wiring 211 to the potential of the wiring 218. The transistors 204 and 205 can function as source follower circuits.

The transistor 206 can have a function of controlling a reading operation. Note that the circuit 201 has a function of a correlated double sampling circuit (CDS circuit), and can be replaced with a circuit with another structure that has the function. Note that the wiring 211 is a wiring that electrically connects the one electrode of the capacitor 202, the one of the source and the drain of the transistor 203, and the gate of the transistor 204.

In one embodiment of the present invention, offset components other than the product of image data (X) and the weight coefficient (W) are eliminated and an objective WX is extracted. WX can be calculated using data of a pixel obtained when image capturing is performed, data of the pixel obtained when image capturing is not performed, and data of the pixel obtained by adding weights to the respective data.

The total amount of currents ($I_p$) flowing through the pixels 100 when image capturing is performed is $k\Sigma(X-V_{th})^2$, and the total amount of currents ($I_p$) flowing through the pixels 100 when weights are added is $k\Sigma(W+X-V_{th})^2$. The total amount of currents ($I_{ref}$) flowing through the pixels 100 when image capturing is not performed is $k\Sigma(0-V_{th})^2$, and the total amount of currents ($I_{ref}$) flowing through the pixels 100 when weights are added is $k\Sigma(W-V_{th})^2$. Here, k is a constant and $V_{th}$ is the threshold voltage of the transistor 105.

First, a difference (data A) between the data obtained when image capturing is performed and the data obtained by adding a weight to the data is calculated. The difference is $k\Sigma((0-V_{th})^2-(W+X-V_{th})^2)=k\Sigma(-W^2-2W\cdot X+2W\cdot V_{th})$.

Next, a difference (data B) between the data obtained when image capturing is not performed and the data obtained by adding a weight to the data is calculated. The difference is $k\Sigma((0-V_{th})^2-(W-V_{th})^2)=k\Sigma(-W^2+2W\cdot V_{th})$.

Then, a difference between the data A and the data B is calculated. The difference is $k\Sigma(-W^2-2W\cdot X+2W\cdot V^{th}-(-W^2+2W\cdot V_{th}))=l\Sigma(-2W\cdot X)$. That is, offset components other than the product of the image data (X) and the weight coefficient (W) can be eliminated.

The circuit 201 can read out the data A and the data B. Note that the calculation of the difference between the data A and the data B can be performed by the circuit 301, for example.

<Filter>

Here, the weights supplied to the entire pixel block 200 function as a filter. As the filter, a convolutional filter of a convolutional neural network (CNN) can be used, for example. Alternatively, an image processing filter such as an edge extraction filter can be used. As examples of the edge extraction filter, a Laplacian filter illustrated in FIG. 5A, a Prewitt filter illustrated in FIG. 5B, a Sobel filter illustrated in FIG. 5C, and the like can be given.

In the case where the number of pixels 100 included in the pixel block 200 is 3×3, elements of the edge extraction filter can be assigned and supplied as weights to the pixels 100. As described above, to calculate the data A and the data B, data obtained when image capturing is performed, data obtained when image capturing is not performed, and data obtained by adding weights to the respective data can be utilized. Here, the data to which weights are not added can also be referred to as data obtained by adding a weight 0 to all the pixels 100.

The edge extraction filters illustrated as examples in FIG. 5A to FIG. 5C are filters where the sum ($\Sigma\Delta W/N$, N is the number of elements) of elements (weights: $\Delta W$) is 0. Therefore, without an additional operation of supplying $\Delta W=0$ from another circuit, the operation of obtaining $\Sigma\Delta W/N$ enables the data corresponding to the data obtained by adding $\Delta W=0$ to all the pixels 100 to be obtained.

This operation corresponds to turning on the transistors 150 (the transistors 150a to 150j) provided between the pixels 100 (see FIG. 2). By turning on the transistors 150, the node FDW in each of the pixels 100 is short-circuited through the wiring 117. At this time, charge accumulated in the node FDW in each of the pixels 100 is redistributed, and in the case where any of the edge extraction filters illustrated as examples in FIG. 5A to FIG. 5C is used, the potential of the node FDW ($\Delta W$) becomes 0 or substantially 0. Thus, the data corresponding to the data obtained by adding $\Delta W=0$ can be obtained.

Note that in the case of rewriting weights ($\Delta W$) by supplying charge from a circuit outside the pixel array 300, it takes time to complete rewriting owing to the capacitance of the long-distance wiring 111 or the like. In contrast, the pixel block 200 is a minute region, and the wiring 117 has a short distance and a small capacitance. Therefore, weights ($\Delta W$) can be rewritten at high speed by the operation of redistributing charge accumulated in the nodes FDW inside the pixel block 200.

In the pixel block 200 illustrated in FIG. 2, the transistors 150a to 150j are electrically connected to different gate lines (wirings 113a to 113j) from each other. With this structure, the conductions of the transistors 150a to 150j can be controlled independently of each other, and the operation of obtaining $\Sigma\Delta W/N$ can be performed selectively.

For example, in the case of using a filter illustrated in FIG. 5B, FIG. 5C, or the like, there are some pixels where $\Delta W=0$ is initially supplied. Assuming that $\Sigma\Delta W/N=0$, the pixels where $\Delta W=0$ is supplied may be excluded from the target of summation. The exclusion of the pixels eliminates the need of supplying the potential for operating some of the transistors 150a to 150j, suppressing power consumption.

Figure 6:
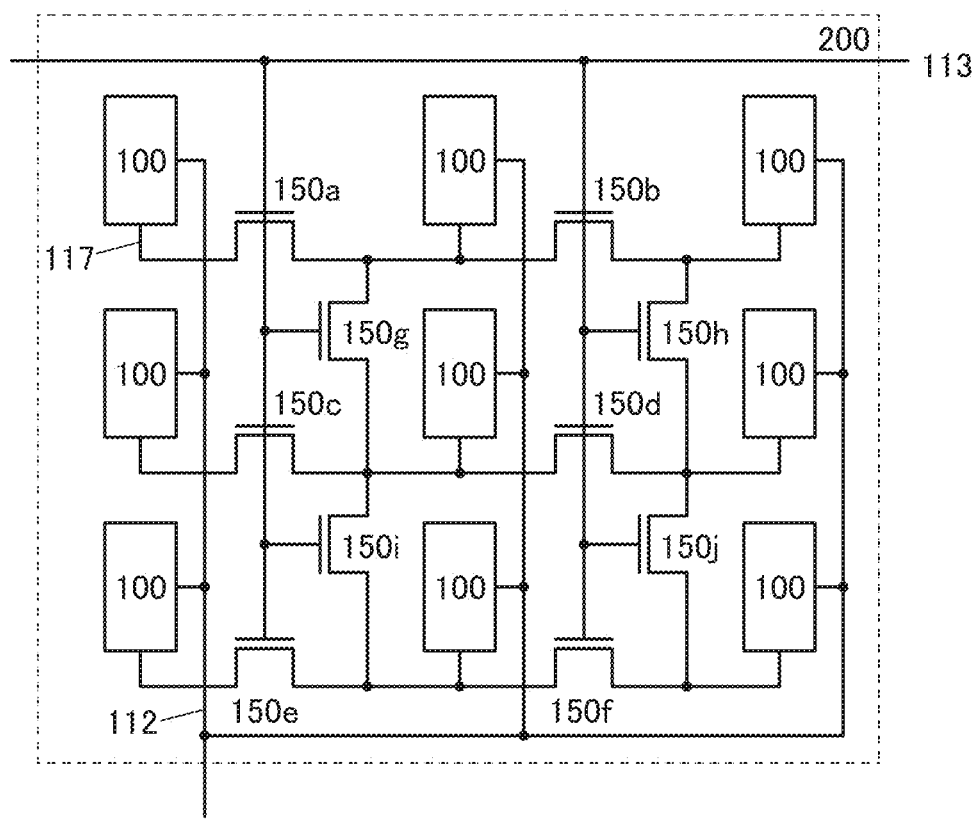
FIG. 6 is a diagram illustrating the pixel block 200.

Note that in the case of performing the operation of obtaining $\Sigma\Delta W/N$ on all the pixels, a structure where the transistors 150a to 150j are electrically connected to one gate line (the wiring 113) as illustrated in FIG. 6 can also be employed. With this structure, the number of gate lines can be reduced and simplified control is possible.

Although nine transistors 150 (the transistors 150a to 150j) are provided between the pixels 100 in the examples illustrated in FIG. 2 and FIG. 6, the number of transistors 150 may be further increased. Moreover, some of the transistors 150g to 150j may be omitted so that parallel paths can be eliminated.

Although examples of using the filters with $\Sigma\Delta W/N=0$ are described above, a filter with $\Sigma\Delta W/N\neq 0$ can be used as well. For example, in the case of a filter as illustrated in FIG. 7A with a center value of 1 and values in 8 directions from the center of 0, the initially supplied weight ($\Delta W$) is 0 or 1, and $\Sigma\Delta W/N=\frac{1}{9}$ is obtained. When the difference is calculated by the above-described operation, the center has an element of 8 and the 8 directions have an element of −1, which are the same as those in the arithmetic operation using the constant multiples of the Laplacian filter illustrated in FIG. 5A.

Furthermore, in the case of a filter including a row with 0, a row with 1, and a row with 2 in order as illustrated in FIG. 7B, $\Sigma\Delta W/N=1$ is obtained. When the difference is calculated in the above-described manner, the respective rows become the row with −1, the row with 0, and the row with 1. This is the same as the arithmetic operation using the Prewitt filter illustrated in FIG. 5B.

Although two examples of FIG. 7A and FIG. 7B are described above, the filter is basically arbitrary and, other than the use of the known filters, a variety of arithmetic operations can be performed.

<Image Capturing Operation>

Figure 8:
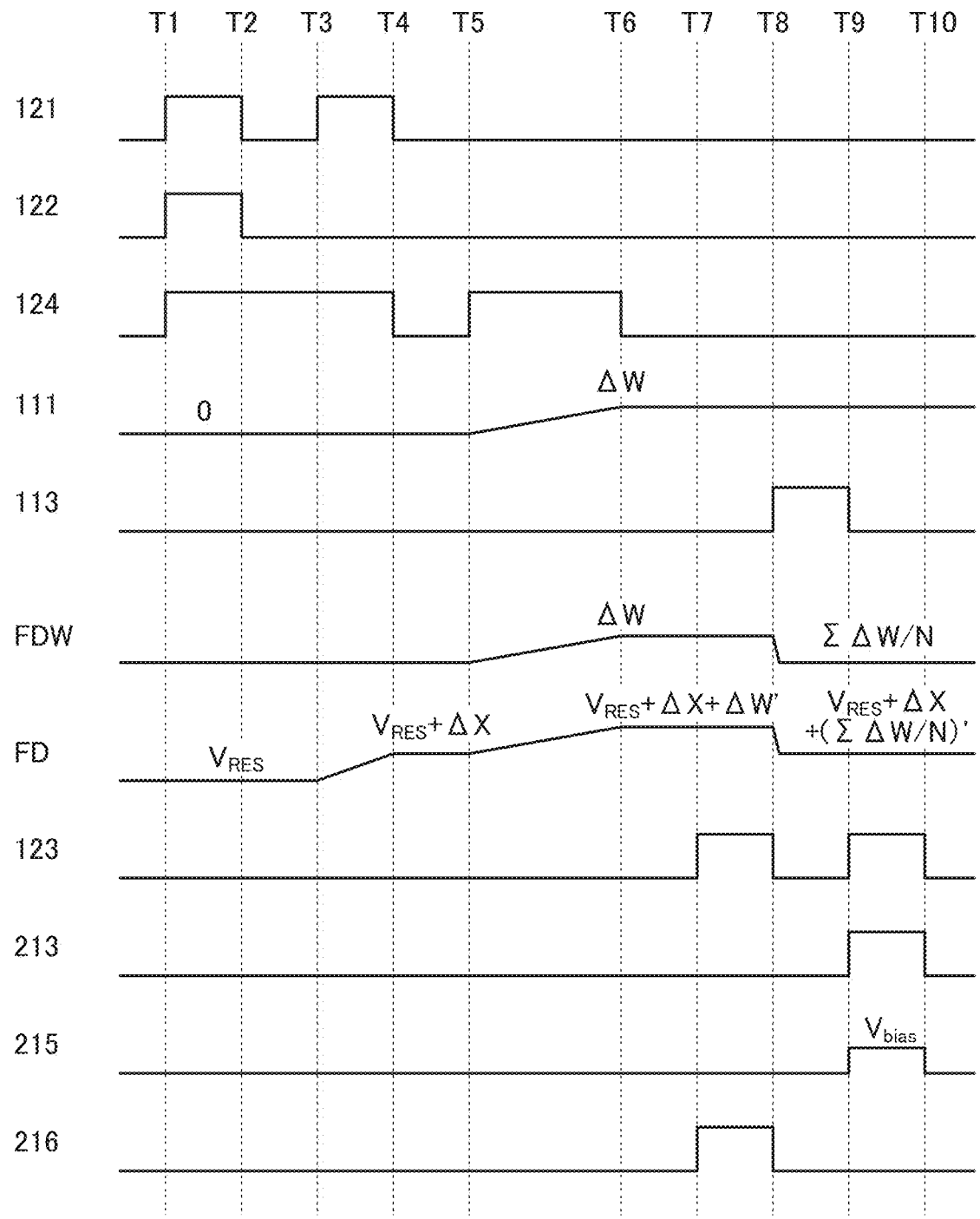
FIG. 8 is a timing chart illustrating an operation of an imaging device.

Next, an image capturing operation and a product-sum operation are described using a timing chart illustrated in FIG. 8. Note that the pixel block 200 described here has the structure illustrated in FIG. 6, and the pixel 100 has the structure illustrated in FIG. 3A or FIG. 3B. Furthermore, predetermined constant potentials are supplied to power supply lines and the like. Note that in the following description, a high potential is represented by "H" and a low potential is represented by "L."

At Time T1, the potential of the wiring 121 is set at "H," the potential of the wiring 122 is set at "H," and the potential of the wiring 124 is set at "H," so that the transistors 102 and 103 are turned on and the potential of the node FD becomes a reset potential (the potential of the wiring 115) "$V_{RES}$." Furthermore, the transistor 106 is turned on and the potential of the node FDW becomes "L" (=0).

At Time T2, the potential of the wiring 121 is set at "L," the potential of the wiring 122 is set at "L," and the potential of the wiring 124 is set at "H," so that the transistors 102 and 103 are turned off and the reset potential "$V_{RES}$" is retained in the node FD.

At Time T3, the potential of the wiring 121 is set at "H," the potential of the wiring 122 is set at "L," and the potential of the wiring 124 is set at "H," so that the transistor 102 is turned on and the potential of the node FD changes to "$V_{RES}+\Delta X$" by the operation of the photoelectric conversion device 101.

At Time T4, the potential of the wiring 121 is set at "L," the potential of the wiring 122 is set at "L," and the potential of the wiring 124 is set at "L," so that the transistors 102 and 106 are turned off and the potential "$V_{RES}+\Delta X$" is retained in the node FD. "$\Delta X$" is a potential corresponding to image data. The description so far corresponds to the basic operation of image capturing.

<Product-Sum Operation>

Next, an operation of calculating the data A and the data B described above by the product-sum operation in the pixels 100 and the circuit 201 is described. Note that although the operation of one pixel is described above, the pixel block 200 includes the plurality of pixels 100.

Thus, after the image capturing operation has finished in all the pixels 100 in the pixel block 200, the operation described next can be performed.

At Time T5, the potential "$\Delta W$" corresponding to a weight is supplied to the wiring 111 and the potential of the wiring 124 is set at "H," so that the transistor 106 is turned on and the potential "$\Delta W$" is written to the node FDW. This causes capacitive coupling of the capacitor 107, so that the amount of change in the potential of the node FDW is added to the node FD and the potential of the node FD changes to "$V_{RES}+\Delta X+\Delta W$'." Note that if the capacitance of the capacitor 107 is sufficiently larger than the capacitance of the node FD, "$\Delta W$" and "$\Delta W$'" are almost the same value.

At Time T6, the potential of the wiring 124 is set at "L," so that the transistor 106 is turned off; accordingly, the potential "$\Delta W$" is retained in the node FDW and the potential "$V_{RES}+\Delta X+\Delta W$'" is retained in the node FD.

At Time T7, the potential of the wiring 123 is set at "H," and the potential of the wiring 216 (see FIG. 2) is set at "H," so that the transistor 105 is turned on and a current corresponding to the potential of the node FD flows from the wiring 112 to the transistor 104. Furthermore, the transistor 203 is turned on in the circuit 201, so that the potential of the wiring 211 becomes the potential of the wiring 218 "Vr." In other words, when the potential of the other electrode of the capacitor 202 is the output potential of the case where the weights are added to the image data obtained by the pixels 100, the one electrode of the capacitor 202 is initialized to the potential "Vr."

At Time T8, the potential of the wiring 113 (see FIG. 6) is set at "H," so that the transistors 150a to 150j are turned on, the node FDW in each of the pixels 100 is short-circuited, charge is redistributed, and the potential of the node FDW becomes "$\Sigma\Delta W/N$." This causes capacitive coupling of the capacitor 107, so that the amount of change in the potential of the node FDW is added to the node FD and the potential of the node FD changes to "$V_{RES}+\Delta X+(\Sigma\Delta W/N)$'." Here, if the capacitance of the capacitor 107 is sufficiently larger than the capacitance of the node FD, "$\Sigma\Delta W/N$" and "$(\Sigma\Delta W/N)$'" are almost the same value. In other words, assuming "$\Sigma\Delta W/N$"=0, "$(\Sigma\Delta W/N)$'"=0 is obtained.

At Time T9, the potential of the wiring 113 is set at "L," the potential of the wiring 123 is set at "H," the potential of the wiring 213 is set at "H," and the potential of the wiring 215 is set at an appropriate analog potential such as "Vbias," so that the potential of the node FDW and the potential of the node FD are retained. Furthermore, the transistor 105 is turned on, so that a current corresponding to the potential of the node FD flows from the wiring 112 to the transistor 104. Here, the potential of the other electrode of the capacitor 202 changes in accordance with the current flowing through the wiring 112, and an amount Y of the change is added to the potential "Vr" of the wiring 211 by capacitive coupling.

Accordingly, the potential of the wiring 211 becomes "Vr+Y." Here, given that Vr=0, Y is the difference itself, which means that the data A is calculated. The circuit 201 can output a signal potential corresponding to the data A by a source follower operation.

In the same step, the difference (data B) between the data obtained when image capturing is not performed and the data obtained by adding a weight to the data can be calculated. Since image capturing is not performed, the accumulation operation is not performed. For example, the wiring 122 is set at "H" when the wiring 121 is at "H," so that the potential of the node FD can be kept at the reset potential. Alternatively, an operation not provided with the period in which the potential of the wiring 121 is at "H" may be performed.

The data A and the data B output from the circuit 201 in the above operations are input to the circuit 301. Calculation of the difference between the data A and the data B is performed in the circuit 301, so that unnecessary offset components other than the product of the image data and the weight coefficient can be eliminated. The circuit 301 may have a structure in which the difference is calculated by utilizing a memory circuit (also referred to as a storage circuit) and software processing, other than the structure including an arithmetic circuit such as the circuit 201.

The weight coefficient can be output from the circuit 305 illustrated in FIG. 1 to the wiring 111, and it is preferable to rewrite the weight coefficient more than once in a frame period.

As the circuit 305, a decoder can be used. The circuit 305 may include a D/A converter or an SRAM.

A signal potential can be output from the circuit 303 to the wiring 124 for selecting the pixel 100 to which the weight coefficient is input. As the circuit 303, a decoder or a shift register can be used.

A signal potential can be output from the circuit 304 to the wiring 123 or the like connected to the gate of the transistor 105 of the pixel 100. As the circuit 304, a decoder or a shift register can be used.

A signal potential can be output from the circuit 306 to the wiring 113 connected to the gate of the transistor 150 included in the pixel block 200. As the circuit 306, a decoder or a shift register can be used.

Although the processing of data of the captured image is described above, image data without processing can be extracted in the imaging device of one embodiment of the present invention.

In the product-sum operation, pixels in a plurality of rows are preferably selected at a time. Meanwhile, in the case where only imaging data is extracted, data is desirably extracted from pixels in one row. In one embodiment of the present invention, the circuit 304 for selecting the pixels 100 has a function of changing the number of rows to be selected.

<Shift Register>

Figure 9:
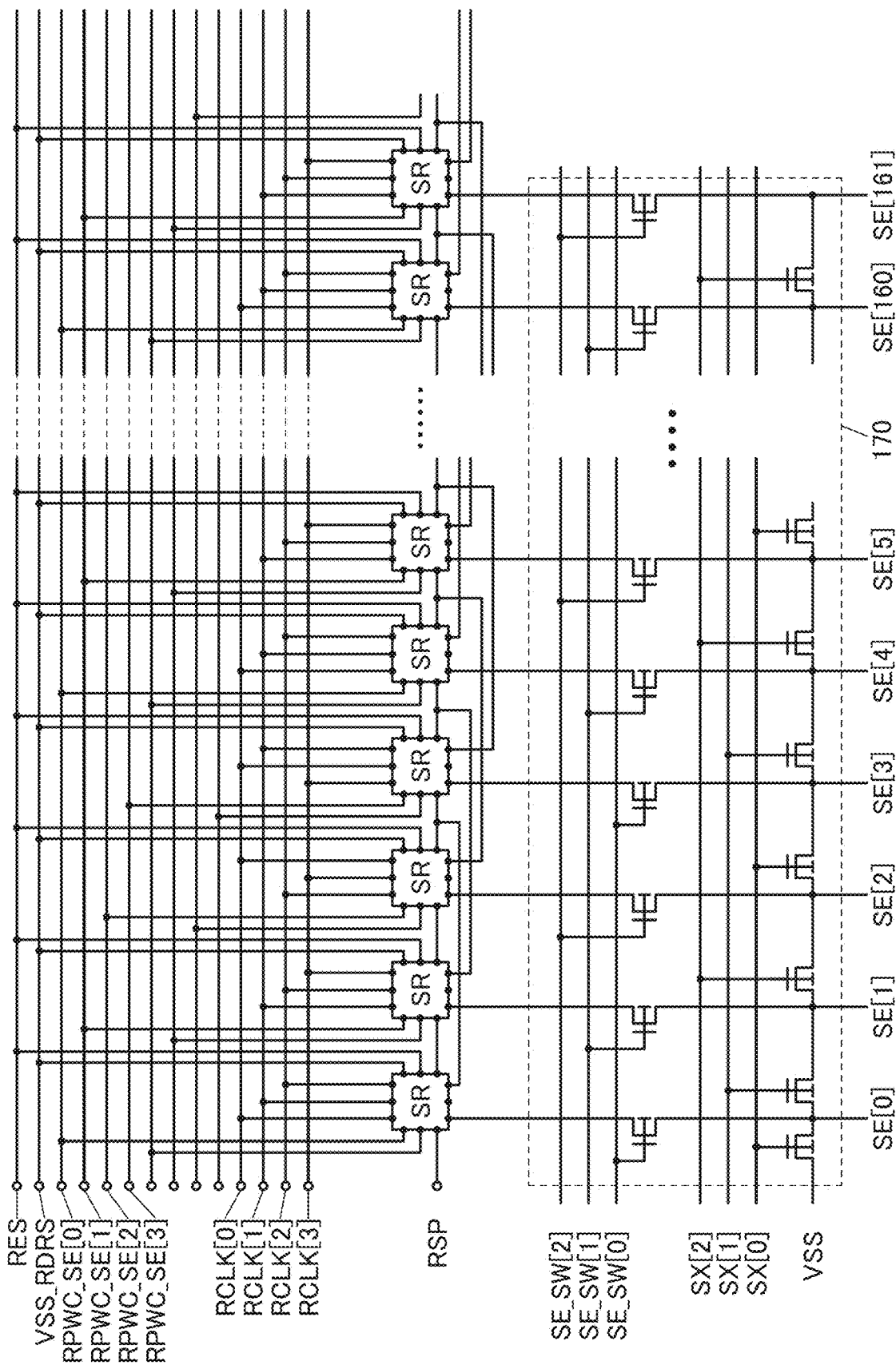
FIG. 9 is a diagram illustrating an example of a circuit 304.

FIG. 9 is an example of a circuit that can be used as the circuit 304. The circuit is a shift register circuit, in which a plurality of logic circuits (SR) are electrically connected. To the logic circuits (SR), signal lines such as a wiring RES, a wiring VSS_RDRS, wirings RPWC_SE[0:3], wirings RCLK[0:3], and a wiring RSP are connected and appropriate signal potentials are input to the respective signal lines, so that selection signal potentials can be sequentially output from the logic circuits (SR).

A circuit 170 is electrically connected to the logic circuits (SR). A plurality of transistors are provided in the circuit 170 and are connected to signal lines such as wirings SE_SW[0:2] and wirings SX[0:2]. When appropriate signal potentials are input to the respective signal lines, conduction of the transistors is controlled. By the control by the circuit 170, the number of rows of pixels to be selected can be changed.

One of a source and a drain of one transistor is electrically connected to an output terminal of one logic circuit (SR), and a wiring SE is connected to the other of the source and the drain of the transistor. The wiring SE is electrically connected to the wiring 122 for selecting the pixel 100.

A signal potential supplied from the wiring SE_SW[0] can be input to a gate of the transistor connected to the wiring SE[0]. A signal potential supplied from the wiring SE_SW[1] can be input to a gate of the transistor connected to the wiring SE[1]. A signal potential supplied from the wiring SE_SW[2] can be input to a gate of the transistor connected to the wiring SE[2]. Signal potentials supplied from any of the wirings SE_SW[0:2] can be input to gates of the transistors connected to the wiring SE[3] and the subsequent wirings SE in the same order.

Moreover, adjacent wirings SE are electrically connected to each other through one transistor, and the wiring SE[0] is electrically connected to a power supply line (VSS) through one transistor.

A signal potential supplied from the wiring SX[0] can be input to a gate of the transistor that electrically connects the power supply line (VSS) and the wiring SE[0]. A signal potential supplied from the wiring SX[1] can be input to a gate of the transistor that electrically connects the wiring SE[0] and the wiring SE[1]. A signal potential supplied from the wiring SX[2] can be input to a gate of the transistor that electrically connects the wiring SE[1] and the wiring SE[2]. Any of signal potentials supplied from the wirings SX[0:2] can be input to gates of the transistors that electrically connect the subsequent adjacent wirings SE in the same order.

Figure 10:
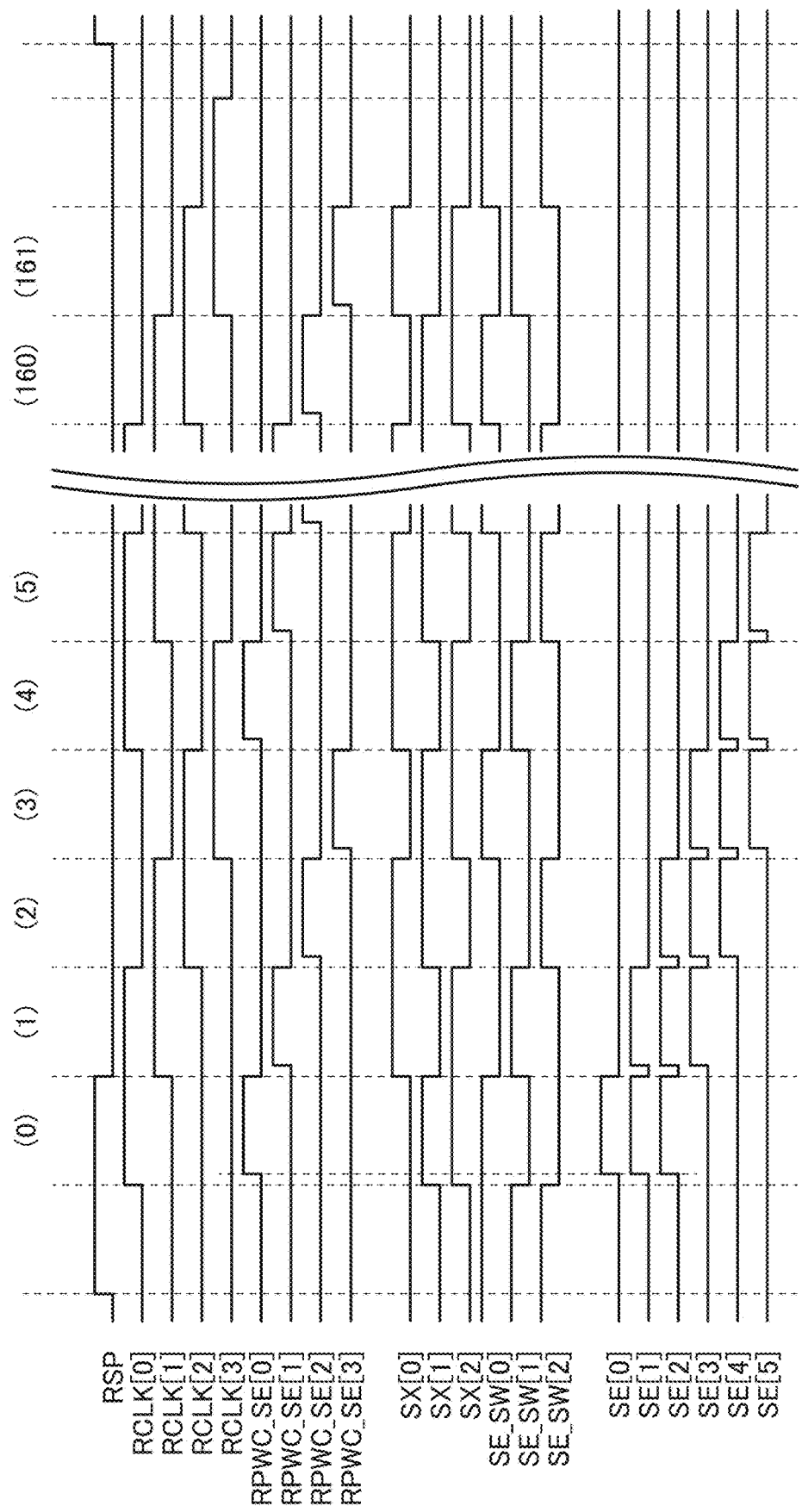
FIG. 10 is a timing chart illustrating an operation of the circuit 304.

FIG. 10 is a timing chart illustrating an operation in which a plurality of rows (three rows) are selected at a time by the circuit illustrated in FIG. 9. Note that (0) to (161) correspond to timings at which the logic circuits (SR) output signal potentials to the wirings SE.

When the potential of the wiring SX[0] is "L," the potential of the wiring SX[1] is "H," the potential of the wiring SX[2] is "H," the potential of the wiring SE_SW[0] is "H," the potential of the wiring SE_SW[1] is "L," and the potential of the wiring SE_SW[2] is "L" at the timing (0), conduction of the respective transistors is controlled and "H," "H," and "H" are output to the wiring SE[0], the wiring SE[1], and the wiring SE[2], respectively. To the other wirings SE, "L" is output.

Thus, three rows can be selected at a time, and a product-sum operation of pixels in three rows and three columns can be performed, for example.

When the potential of the wiring SX[0] is "H," the potential of the wiring SX[1] is "L," the potential of the wiring SX[2] is "H," the potential of the wiring SE_SW[0] is "L," the potential of the wiring SE_SW[1] is "H," and the potential of the wiring SE_SW[2] is "L" at the timing (1), conduction of the respective transistors is controlled and "L," "H," "H," and "H" are output to the wiring SE[0], the wiring SE[1], the wiring SE[2], and the wiring SE[3], respectively. To the other wirings SE, "L" is output.

That is, at the timing (1), a product-sum operation with a stride of 1, in which a one-row shift from the timing (0) is made, can be performed.

Figure 11:
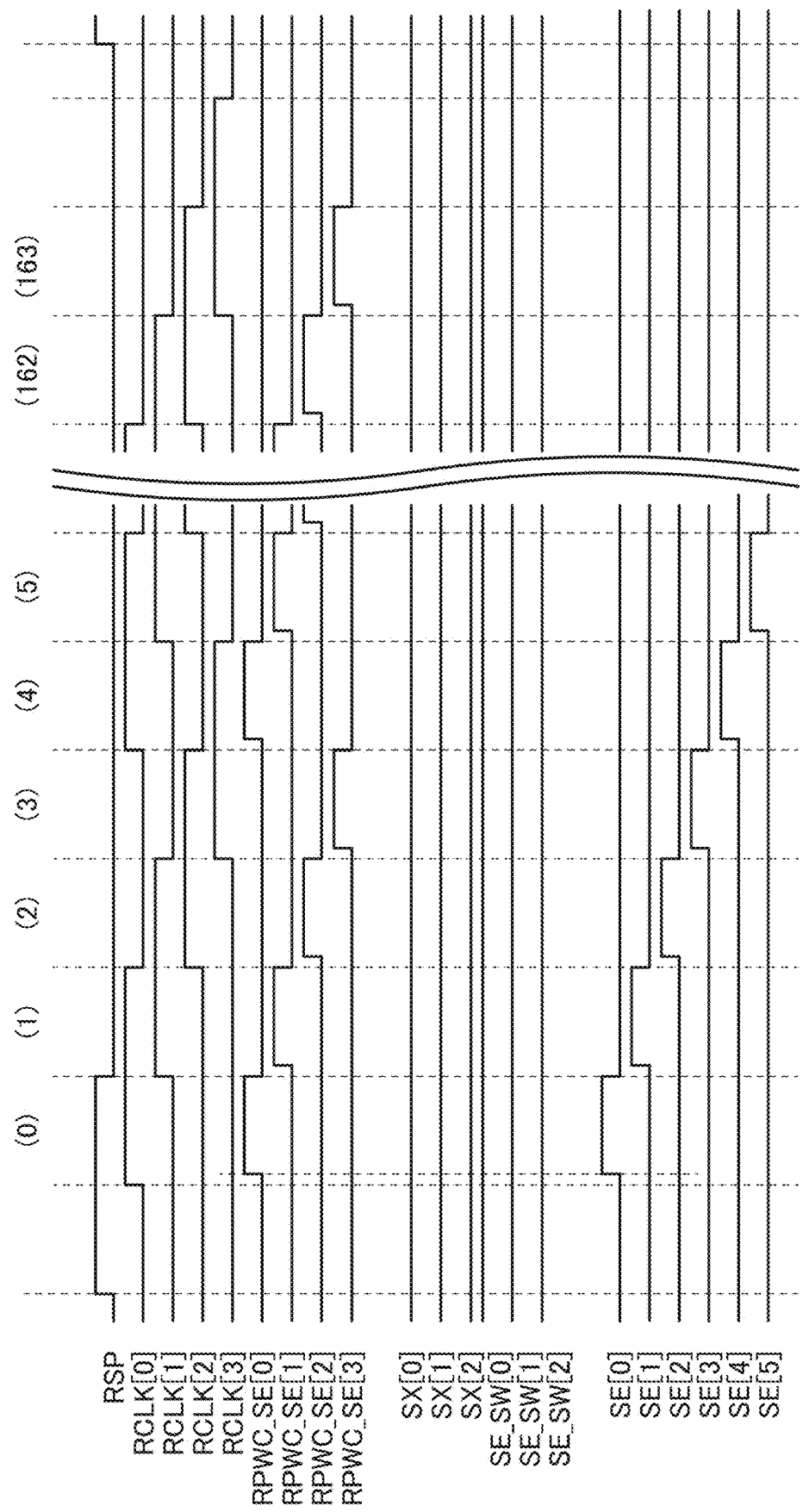
FIG. 11 is a timing chart illustrating an operation of the circuit 304.

FIG. 11 is a timing chart illustrating an operation in which one row is selected by the circuit illustrated in FIG. 9.

In the operation according to the timing chart, the potentials of the wirings SE_SW[0:2] always remain at "H", and the potentials of the wirings SX[0:2] always remain at "L". Thus, outputs of the logic circuits (SR) come to the respective wirings SE as they are, which enables selection on a one row basis.

<Circuits 301 and 302>

Figure 12A:
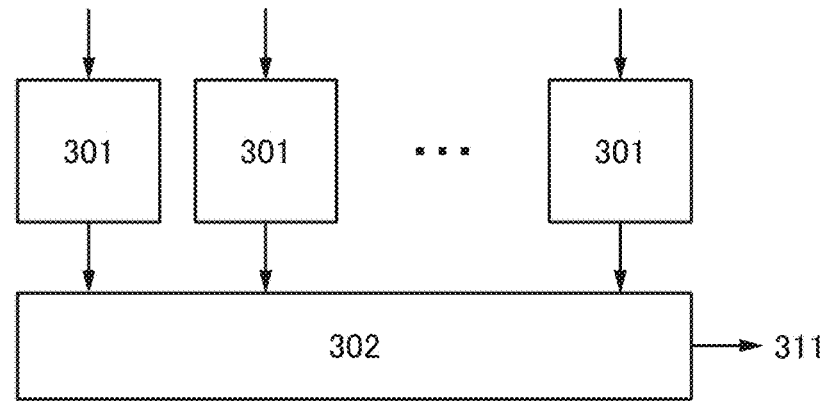
FIG. 12A and FIG. 12B are diagrams illustrating circuits 301 and a circuit 302.

FIG. 12A is a diagram illustrating the circuit 302 and the circuits 301 connected to the circuit 201. Product-sum operation result data output from the circuit 201 are sequentially input to the circuits 301. The circuits 301 may each have a variety of arithmetic functions in addition to the above-described function of calculating the difference between the data A and the data B. For example, the circuits 301 can have a structure similar to that of the circuit 201. Alternatively, the function of the circuits 301 may be replaced by software processing.

The circuits 301 may each include a circuit that performs an arithmetic operation of an activation function. A comparator circuit can be used as the circuit, for example. A comparator circuit outputs a result of comparing input data and a set threshold as binary data. In other words, the pixel blocks 200 and the circuits 301 can operate as part of elements in a neural network.

The circuit 301 may include an A/D converter. When image data is output to the outside without a product-sum operation or the like, analog data can be converted into digital data by the circuit 301.

Furthermore, in the case where the data output from the pixel blocks 200, which corresponds to image data of a plurality of bits, can be binarized by the circuits 301, the binarization can be rephrased as compression of image data.

Data output from the circuits 301 are sequentially input to the circuit 302. The circuit 302 can have a structure including a latch circuit, a shift register, and the like, for example. With this structure, parallel—serial conversion can be performed and data input in parallel can be output to a wiring 311 as serial data. The connection destination of the wiring 311 is not limited. For example, it can be connected to a neural network, a memory device, a communication device, or the like.

Figure 12B:
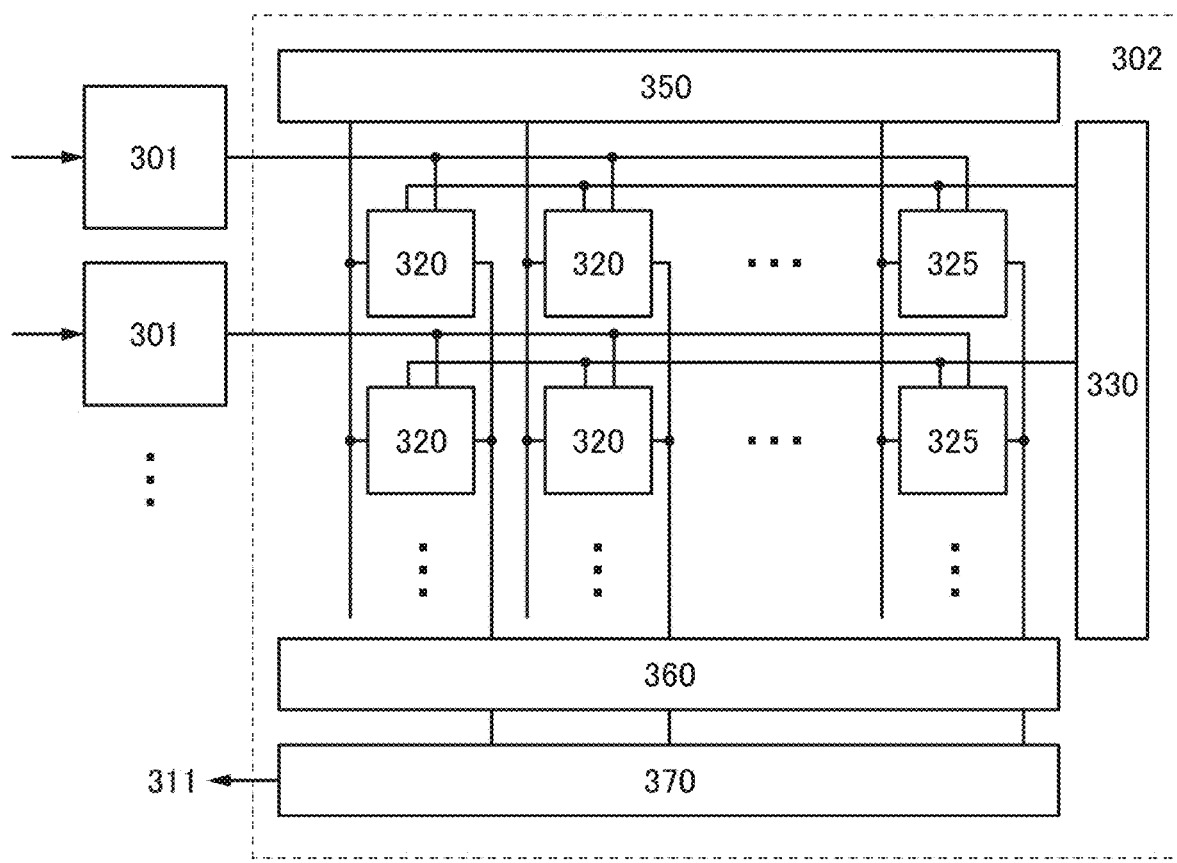

Moreover, as illustrated in FIG. 12B, the circuit 302 may have a structure of a neural network. The neural network includes memory cells arranged in a matrix, and each memory cell retains a weight coefficient. Data output from the circuits 301 are input to corresponding memory cells 320, and a product-sum operation can be performed. Note that the number of memory cells illustrated in FIG. 12B is an example, and the number is not limited.

The neural network illustrated in FIG. 12B includes the memory cells 320 and reference memory cells 325 which are arranged in a matrix, a circuit 330, a circuit 350, a circuit 360, and a circuit 370.

Figure 13:
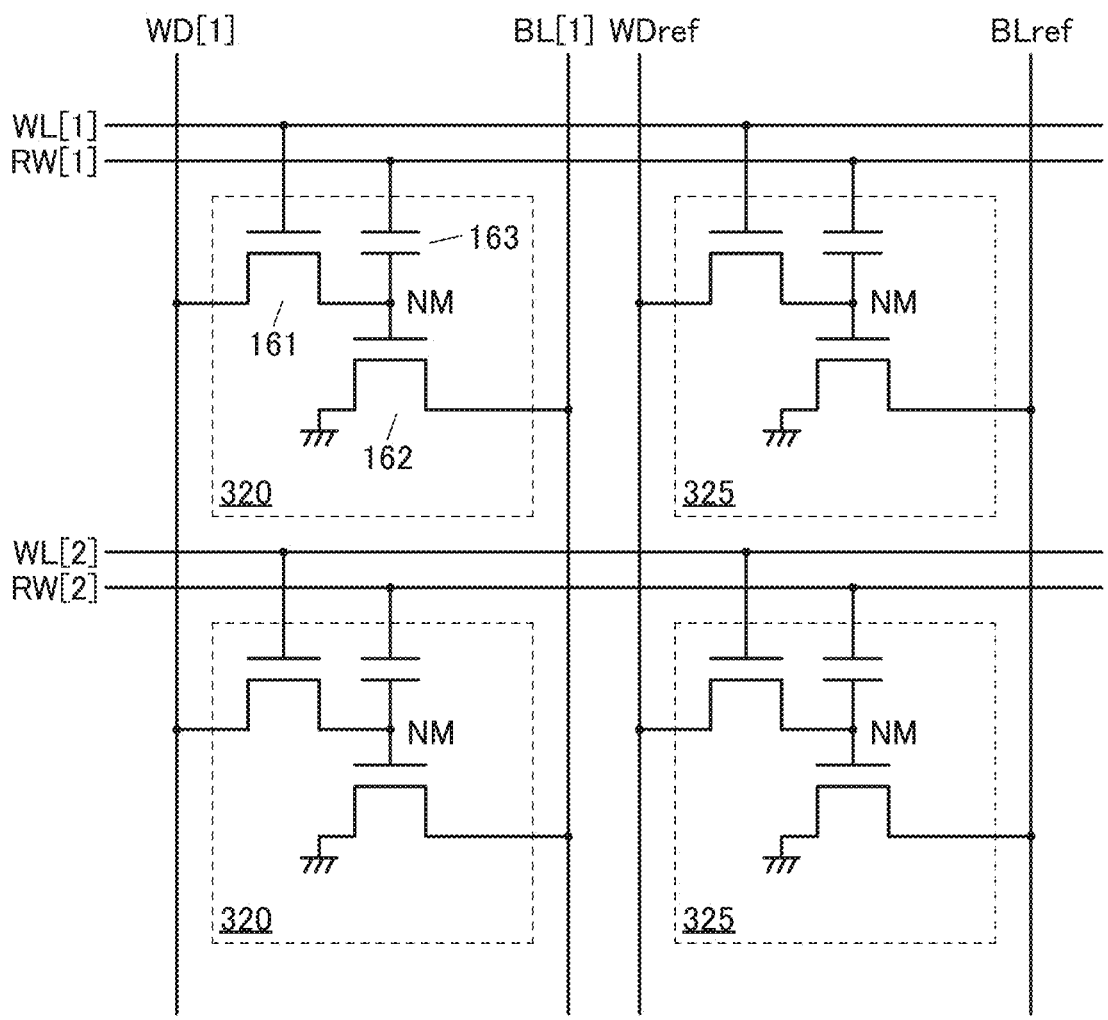
FIG. 13 is a diagram illustrating memory cells.

FIG. 13 illustrates an example of the memory cells 320 and the reference memory cells 325. The reference memory cells 325 are provided in an arbitrary one column. The memory cells 320 and the reference memory cells 325 have similar structures and each include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point where the one of the source and the drain of the transistor 161, the gate of the transistor 162, and the one electrode of the capacitor 163 are connected is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cell 320, the other of the source and the drain of the transistor 161 is electrically connected to a wiring WD. The other of the source and the drain of the transistor 162 is electrically connected to a wiring BL.

In the reference memory cell 325, the other of the source and the drain of the transistor 161 is electrically connected to a wiring WDref. The other of the source and the drain of the transistor 162 is electrically connected to a wiring BLref.

The wiring WL is electrically connected to the circuit 330. As the circuit 330, a decoder, a shift register, or the like can be used.

The wiring RW is electrically connected to the circuit 301. Binary data output from the circuit 301 is written to each memory cell. Note that a sequential circuit such as a shift register may be included between the circuit 301 and the memory cells.

The wiring WD and the wiring WDref are electrically connected to the circuit 350. As the circuit 350, a decoder, a shift register, or the like can be used. The circuit 350 may include a D/A converter or an SRAM. The circuit 350 can output a weight coefficient to be written to the node NM.

The wiring BL and the wiring BLref are electrically connected to the circuit 360. The circuit 360 can have a structure equivalent to that of the circuit 201. By the circuit 360, a signal potential of a product-sum operation result from which offset components are eliminated can be obtained.

The circuit 360 is electrically connected to the circuit 370. The circuit 370 can also be referred to as an activation function circuit. The activation function circuit has a function of performing an arithmetic operation for converting the signal potential input from the circuit 360 in accordance with a predefined activation function. As the activation function, for example, a sigmoid function, a tanh function, a softmax function, a ReLU function, a threshold function, or the like can be used. The signal potential converted by the activation function circuit is output to the outside as output data.

Figure 14A:
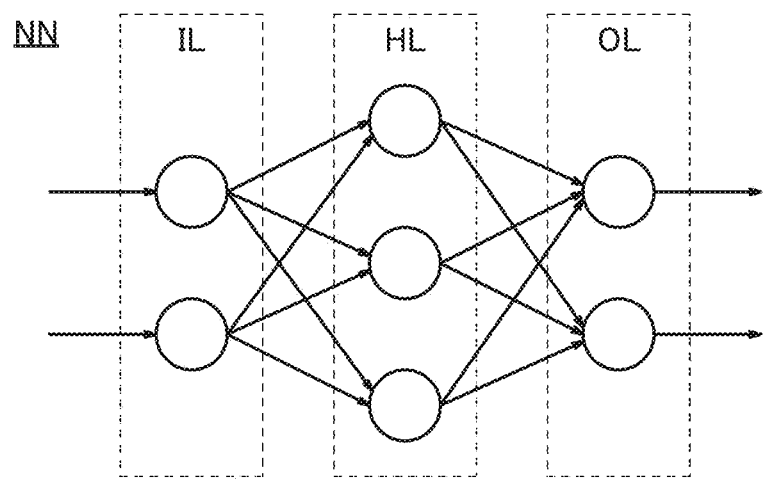
FIG. 14A and FIG. 14B are diagrams illustrating a structure example of a neural network.

As illustrated in FIG. 14A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network). Learning using a deep neural network can also be referred to as deep learning.

Input data is input to each neuron in the input layer IL. A signal output from a neuron in the previous layer or the subsequent layer is input to each neuron in the middle layer HL. To each neuron in the output layer OL, output signals of the neurons in the previous layer are input. Note that each neuron may be connected to all the neurons in the previous and subsequent layers (full connection), or may be connected to some of the neurons.

Figure 14B:
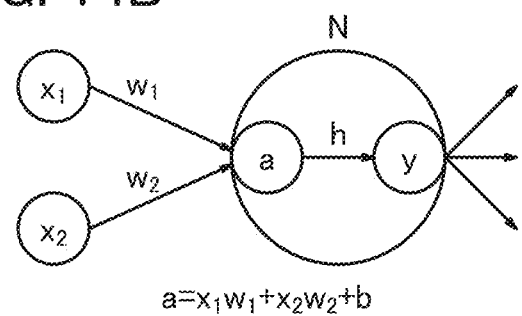

FIG. 14B illustrates an example of an arithmetic operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal y=ah is output from the neuron N.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware.

In one embodiment of the present invention, an analog circuit is used as hardware to perform a product-sum operation. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit preferably has a structure including an OS transistor. An OS transistor is suitably used as a transistor included in an analog memory of the product-sum operation circuit because of its extremely low off-state current. Note that the product-sum operation circuit may be formed using both a Si transistor and an OS transistor.

This embodiment can be combined with the other embodiments as appropriate.

Embodiment 2

In this embodiment, structure examples and the like of the imaging device of one embodiment of the present invention will be described.

<Structure Example>

Figure 15A:
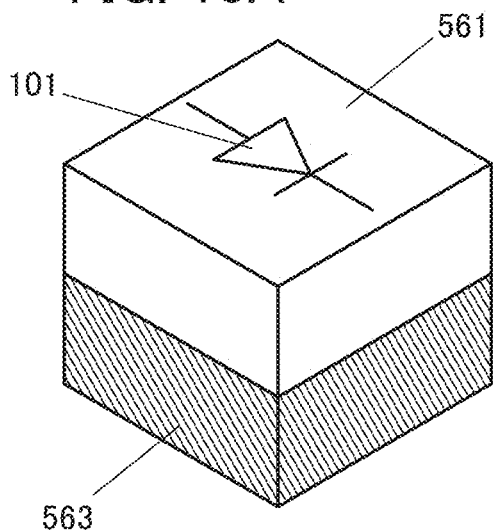
FIG. 15A to FIG. 15D are diagrams illustrating pixel structures of an imaging device.

FIG. 15A is a diagram illustrating a structure example of a pixel in an imaging device, and a stacked-layer structure of a layer 561 and a layer 563 can be employed.

Figure 16A:
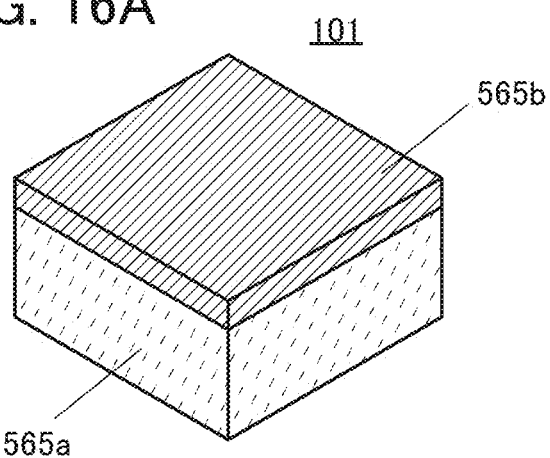
FIG. 16A to FIG. 16C are diagrams illustrating structures of a photoelectric conversion device.

The layer 561 includes the photoelectric conversion device 101. The photoelectric conversion device 101 can include a layer 565a and a layer 565b as illustrated in FIG. 16A. Note that a layer may be rephrased as a region, depending on the case.

The photoelectric conversion device 101 illustrated in FIG. 16A is a pn junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

The pn junction photodiode can be formed typically using single crystal silicon. A photodiode in which single crystal silicon is used for a photoelectric conversion layer has relatively wide spectral sensitivity to light from ultraviolet light to near-infrared light and can detect light of various wavelengths by being combined with an optical conversion layer described later.

Alternatively, a compound semiconductor may be used for the photoelectric conversion layer of the pn junction photodiode. As the compound semiconductor, gallium arsenic phosphide (GaAsP), gallium phosphide (GaP), indium gallium arsenide (InGaAs), lead sulfide (PbS), lead selenide (PbSe), indium arsenide (InAs), indium antimonide (InSb), mercury cadmium telluride (HgCdTe), or the like can be used, for example.

The compound semiconductor is preferably a compound semiconductor including a Group 13 element (e.g., aluminum, gallium, or indium) and a Group 15 element (e.g., nitrogen, phosphorus, arsenic, or antimony) (such a compound semiconductor is also referred to as a Group III—V compound semiconductor) or a compound semiconductor including a Group 12 element (e.g., magnesium, zinc, cadmium, or mercury) and a Group 16 element (e.g., oxygen, sulfur, selenium, or tellurium) (such a compound semiconductor is also referred to as a Group II-VI compound semiconductor).

The use of the compound semiconductor, which can change the bandgap depending on the combination of constituent elements or the atomic ratio of the elements, enables formation of a photodiode having sensitivity to a wide wavelength range from ultraviolet light to infrared light.

Note that the wavelength of ultraviolet light can be generally defined as the vicinity of 0.01 μm to the vicinity of 0.38 μm, the wavelength of visible light can be generally defined as the vicinity of 0.38 μm to the vicinity of 0.75 μm, the wavelength of near-infrared light can be generally defined as the vicinity of 0.75 μm to the vicinity of 2.5 μm, the wavelength of mid-infrared light can be generally defined as the vicinity of 2.5 μm to the vicinity of 4 μm, and the wavelength of far-infrared light can be generally defined as the vicinity of 4 μm to the vicinity of 1000 μm.

For example, to form a photodiode having sensitivity to light from ultraviolet light to visible light, GaP or the like can be used for the photoelectric conversion layer. To form a photodiode having sensitivity to light from ultraviolet light to near-infrared light, silicon, GaAsP, or the like described above can be used for the photoelectric conversion layer. Furthermore, to form a photodiode having sensitivity to light from visible light to mid-infrared light, InGaAs or the like can be used for the photoelectric conversion layer. To form a photodiode having sensitivity to light from near-infrared light to mid-infrared light, PbS, InAs, or the like can be used for the photoelectric conversion layer. To form a photodiode having sensitivity to light from mid-infrared light to far-infrared light, PbSe, InSb, HgCdTe, or the like can be used for the photoelectric conversion layer.

Note that the photodiodes using the above-described compound semiconductors may be pin junction photodiodes as well as pn junction photodiodes. Furthermore, the pn junction and the pin junction may have a heterojunction structure without being limited to a homojunction structure.

For example, in the heterojunction, a first compound semiconductor can be used as one layer of the pn junction structure, and a second compound semiconductor that is different from the first compound semiconductor can be used as the other layer. Furthermore, a first compound semiconductor can be used as any one or two layers of the pin junction structure, and a second compound semiconductor that is different from the first compound semiconductor can be used as the other layer(s). Note that one of the first compound semiconductor and the second compound semiconductor may be a semiconductor of a single element such as silicon.

Note that different materials may be used for different pixels in forming photoelectric conversion layers of photodiodes. With this structure, an imaging device which includes any two kinds of pixels or three kinds of pixels among a pixel that detects ultraviolet light, a pixel that detects visible light, a pixel that detects infrared light, and the like can be formed.

Figure 16B:
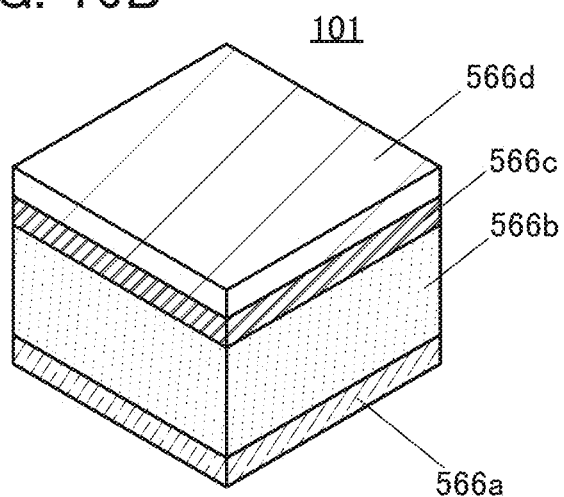

The photoelectric conversion device 101 included in the layer 561 may have a stacked-layer structure of a layer 566a, a layer 566b, a layer 566c, and a layer 566d as illustrated in FIG. 16B. The photoelectric conversion device 101 illustrated in FIG. 16B is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn junction photodiode containing a selenium-based material in a photoelectric conversion layer can be used for the layers 566b and 566c of the photoelectric conversion portion, for example. A selenium-based material, which is a p-type semiconductor, is preferably used for the layer 566b, and gallium oxide or the like, which is an n-type semiconductor, is preferably used for the layer 566c.

A photoelectric conversion device containing a selenium-based material has characteristics of high external quantum efficiency with respect to visible light. In the photoelectric conversion device, electrons are greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As the selenium-based material, crystalline selenium (single crystal selenium or polycrystalline selenium) or amorphous selenium can be used. These selenium-based materials have sensitivity to light from ultraviolet light to visible light. Furthermore, a compound of copper, indium, and selenium (CIS), a compound of copper, indium, gallium, and selenium (CIGS), or the like can be used. These compounds have sensitivity to light from ultraviolet light to near-infrared light.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

Figure 16C:
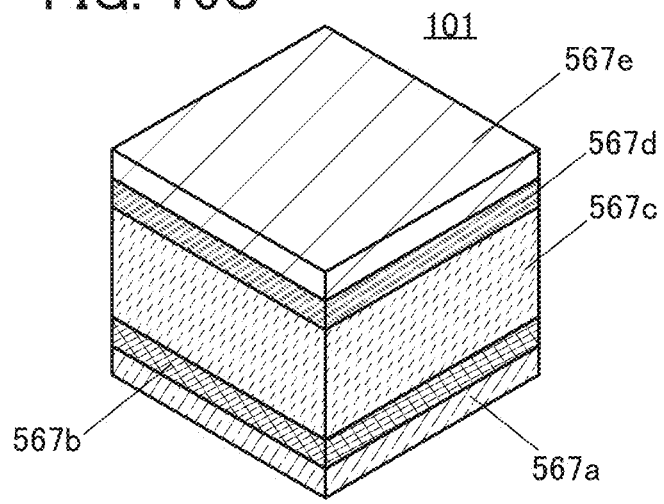

The photoelectric conversion device 101 included in the layer 561 may have a stacked-layer structure of a layer 567a, a layer 567b, a layer 567c, a layer 567d, and a layer 567e as illustrated in FIG. 16C. The photoelectric conversion device 101 illustrated in FIG. 16C is an example of an organic photoconductive film; the layer 567a is a lower electrode, the layer 567e is an upper electrode having a light-transmitting property, and the layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (bulk heterojunction structure) can be used. There are various organic semiconductors, and a material having sensitivity to light with an intended wavelength is selected as a photoelectric conversion layer.

For the layer 563 illustrated in FIG. 15A, a silicon substrate can be used, for example. The silicon substrate includes a Si transistor or the like. With the use of the Si transistor, as well as a pixel circuit, a circuit for driving the pixel circuit, a circuit for reading out an image signal, an image processing circuit, a neural network, a communication circuit, or the like can be formed.

Furthermore, a CPU (Central Processing Unit), an MCU (Micro Controller Unit), a memory circuit such as a DRAM (Dynamic Random Access Memory), or the like may be formed. Note that the above-described circuits except the pixel circuit are each referred to as a functional circuit in this embodiment.

For example, some or all of the transistors included in the pixel circuits (the pixels 100) and the functional circuits (the circuits 201, 301, 302, 303, 304, 305, 306, and the like) described in Embodiment 1 can be provided in the layer 563.

Figure 15B:
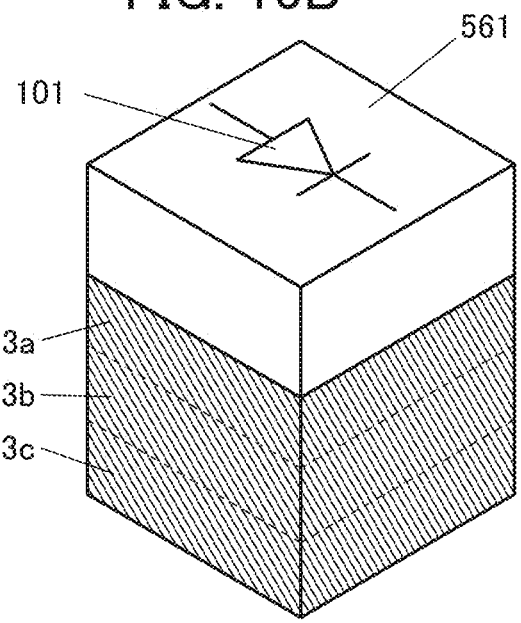

The layer 563 may be a stack of a plurality of layers as illustrated in FIG. 15B.

Although FIG. 15B illustrates an example in which the layer 563 is composed of three layers 563a, 563b, and 563c, a two-layer structure may be employed as well. Alternatively, the layer 563 may be a stack of four or more layers. These layers can be stacked by a bonding process, for example. With this structure, the pixel circuits and the functional circuits can be dispersed in a plurality of layers; thus, the pixel circuits and the functional circuits can be provided to overlap with each other, which enables a small-sized and high-performance imaging device to be manufactured.

Figure 15C:
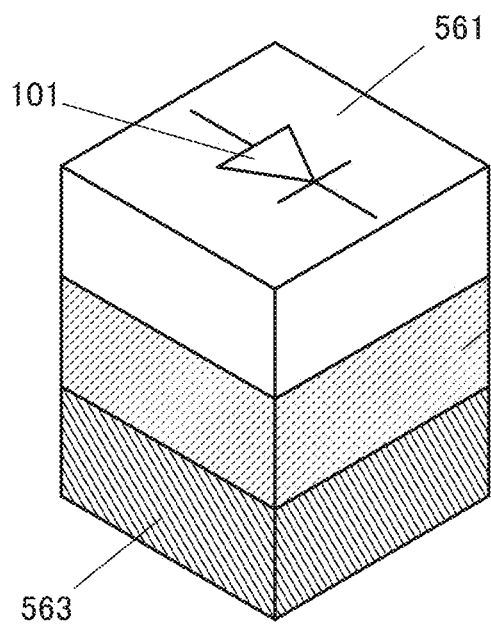

Furthermore, the pixel may have a stacked-layer structure of the layer 561, a layer 562, and the layer 563 as illustrated in FIG. 15C.

The layer 562 can include OS transistors. One or more of the functional circuits described above may be formed using OS transistors. Alternatively, one or more of the functional circuits may be formed using Si transistors included in the layer 563 and the OS transistors included in the layer 562. Alternatively, the layer 563 may be a support substrate such as a glass substrate, and the functional circuits may be formed using the OS transistors included in the layer 562.

A normally-off CPU (also referred to as "NoffCPU (registered trademark)") can be formed using an OS transistor and a Si transistor, for example. Note that the NoffCPU is an integrated circuit including a normally-off transistor, which is in a non-conduction state (also referred to as an off state) even when a gate voltage is 0 V.

In the NoffCPU, power supply to a circuit that does not need to operate can be stopped so that the circuit can be brought into a standby state. The circuit brought into the standby state because of the stop of power supply does not consume power. Thus, the power usage of the NoffCPU can be minimized. Moreover, the NoffCPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the NoffCPU can have a reduced power consumption without a significant decrease in operation speed.

Figure 15D:
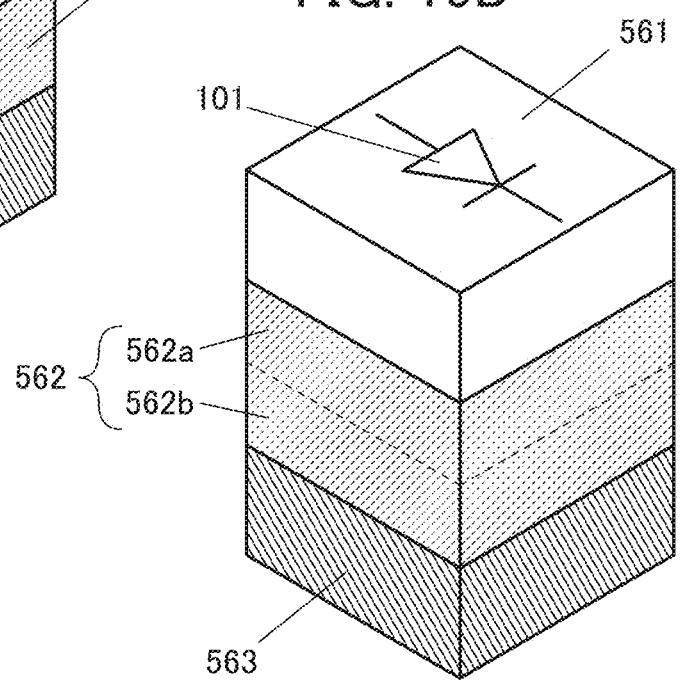

The layer 562 may be a stack of a plurality of layers as illustrated in FIG. 15D. Although FIG. 15D illustrates an example in which the layer 562 is composed of two layers 562a and 562b, a stack of three or more layers may be employed as well. These layers can be formed to be stacked over the layer 563, for example. Alternatively, the layers formed over the layer 563 and the layers formed over the layer 561 may be bonded to each other.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium; and a CAAC-OS, a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In-M-Zn-based oxide that contains indium, zinc, and M (one or more selected from metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements of a sputtering target used for forming the In-M-Zn-based oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{17}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example.

Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (hereinafter, InO$_{X1}$ (X1 is a real number greater than 0)) or indium zinc oxide (hereinafter, In$_{X2}$Zn$_{Y2}$O$_{Z2}$ (X2, Y2, and Z2 are real numbers greater than 0)), and gallium oxide (hereinafter, GaO$_{X3}$ (X3 is a real number greater than 0)) or gallium zinc oxide (hereinafter, Ga$_{X4}$Zn$_{Y4}$O$_{Z4}$ (X4, Y4, and Z4 are real numbers greater than 0)), and a mosaic pattern is formed. Then, InO$_{X1}$ or In$_{X2}$Zn$_{Y2}$O$_{Z2}$ forming the mosaic pattern is evenly distributed in the film (this composition is hereinafter also referred to as a cloud-like composition).

That is, the CAC-OS is a composite oxide semiconductor having a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{X2}Zn_{Y2}O_{Z2}$ or $InO_{X1}$ as a main component are separated to form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, a leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using the CAC-OS has high reliability. Thus, the CAC-OS is suitably used as a constituent material of a variety of semiconductor devices.

<Stacked-Layer Structure 1>

Next, a stacked-layer structure of the imaging device will be described with reference to a cross-sectional view. Note that components such as insulating layers and conductive layers are described below as examples, and other components may be further included. Alternatively, some components described below may be omitted. A stacked-layer structure described below can be formed by a bonding process, a polishing process, or the like as needed.

Figure 17:
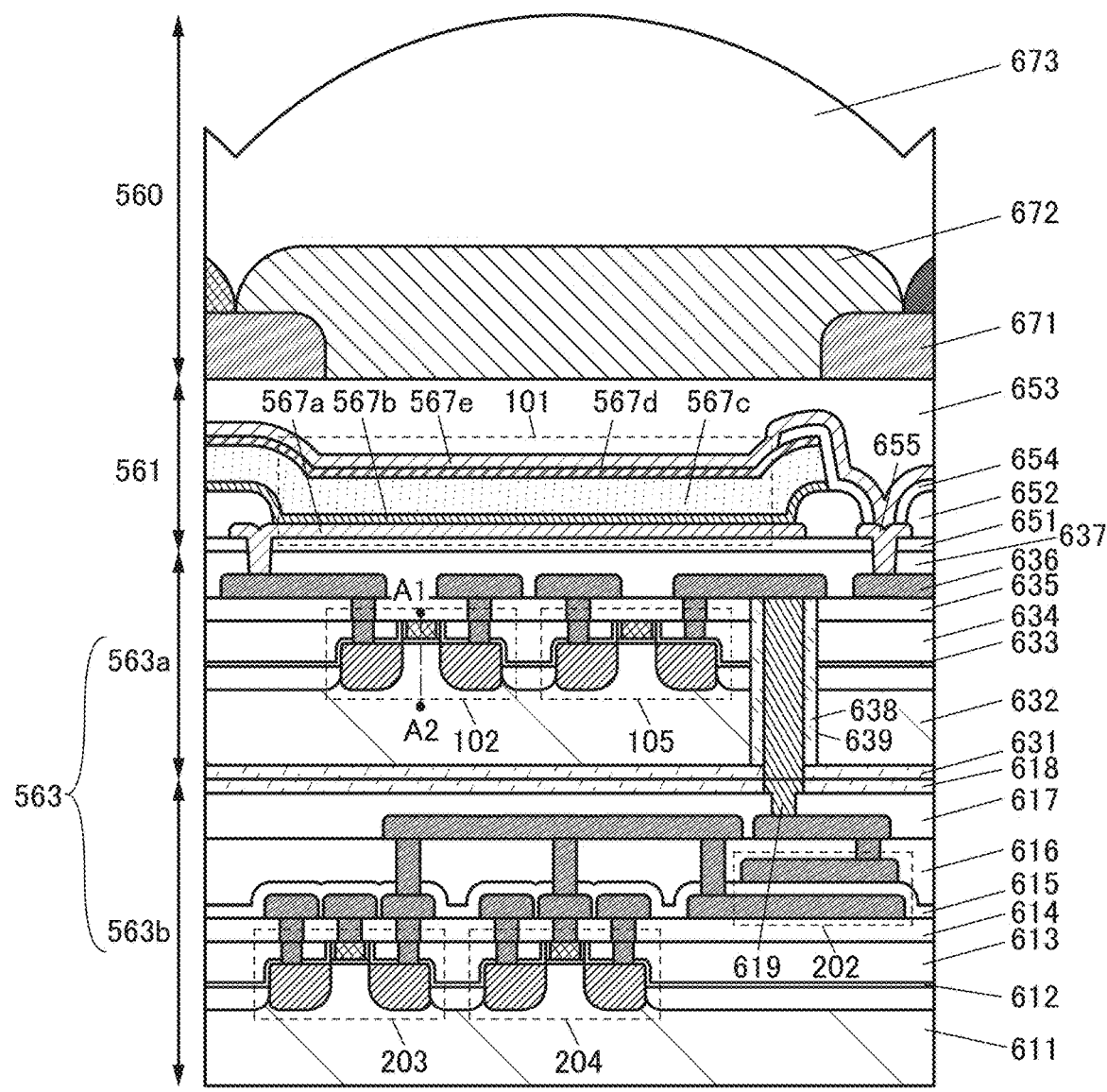
FIG. 17 is a cross-sectional view illustrating a pixel.

FIG. 17 is an example of a cross-sectional view of a stack including a layer 560, the layer 561, and the layer 563 and including a bonding surface between the layer 563a and the layer 563b of the layer 563.

<Layer 563b>

The layer 563b includes a functional circuit provided on a silicon substrate 611. Here, the capacitor 202, the transistor 203, and the transistor 204 each of which is included in the circuit 201 are illustrated as part of the functional circuit. One electrode of the capacitor 202, one of the source and the drain of the transistor 203, and the gate of the transistor 204 are electrically connected to one another.

The silicon substrate 611 and insulating layers 612, 613, 614, 615, 616, 617, and 618 are provided in the layer 563b. The insulating layer 612 functions as a protective film. The insulating layers 613, 613, 616, and 617 function as interlayer insulating films and planarization films. The insulating layer 615 functions as a dielectric layer of the capacitor 202. The insulating layer 618 and a conductive layer 619 function as bonding layers. The conductive layer 619 is electrically connected to the one electrode of the capacitor 202.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. The bonding layers will be described later.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected and used as appropriate. The conductor is not limited to a single layer, and may be a plurality of layers including different materials.

<Layer 563a>

The layer 563a includes the components of the pixel 100. Here, the transistor 102 and the transistor 105 are illustrated as some of the components of the pixel 100. In the cross-sectional view illustrated in FIG. 17, electrical connection between the transistors is not illustrated.

A silicon substrate 632 and insulating layers 631, 633, 634, 635, 637, and 638 are provided in the layer 563a. In addition, conductive layers 636 and 639 are provided.

The insulating layer 631 and the conductive layer 639 function as bonding layers. The insulating layers 634, 635, and 637 function as interlayer insulating films and planarization films. The insulating layer 633 functions as a protective film. The insulating layer 638 has a function of insulating the silicon substrate 632 from the conductive layer 639. The insulating layer 638 can be formed using a material similar to that for another insulating layer. The insulating layer 638 may be formed using the same material as that for the insulating layer 631.

The conductive layer 639 is electrically connected to the other of the source and the drain of the transistor 105 and the conductive layer 619. The conductive layer 636 is electrically connected to the wiring 114 (see FIG. 3A).

Figure 18A:
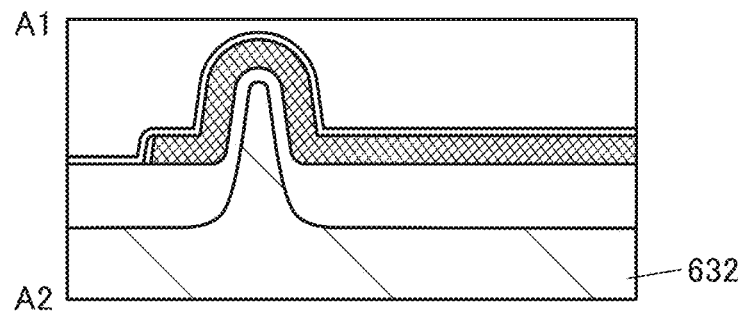
FIG. 18A to FIG. 18C are diagrams illustrating Si transistors.
Figure 18B:
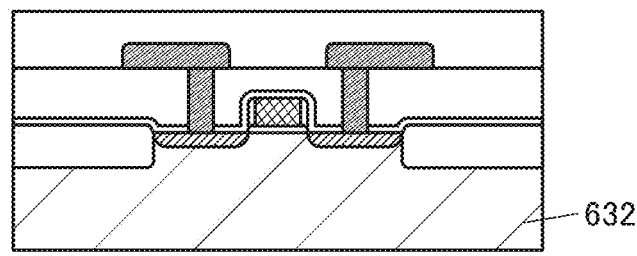

Si transistors (the transistors 102, 105, 203, 204) illustrated in FIG. 17 are fin-type transistors including channel formation regions in the silicon substrates (the silicon substrates 611 and 632). FIG. 18A illustrates a cross section (a cross section along A1-A2 in the layer 563a in FIG. 17) in the channel width direction. Note that the Si transistors may each be a planar-type transistor as illustrated in FIG. 18B.

Figure 18C:
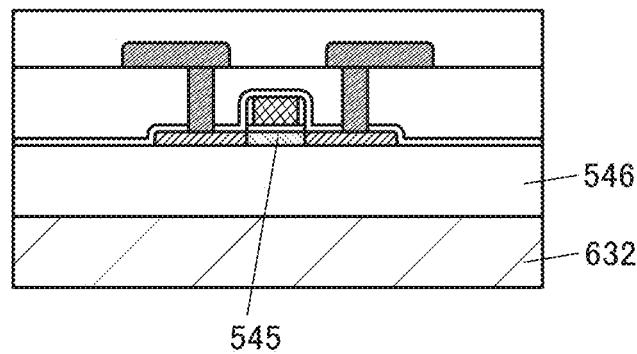

Alternatively, as illustrated in FIG. 18C, a transistor including a semiconductor layer 545 of a silicon thin film may be used. The semiconductor layer 545 can be single crystal silicon (SOI (Silicon on Insulator)) formed on an insulating layer 546 on the silicon substrate 632, for example.

<Layer 561>

The layer 561 includes the photoelectric conversion device 101. The photoelectric conversion device 101 can be formed over the layer 563a. FIG. 17 illustrates the photoelectric conversion device 101 having a structure in which the organic photoconductive film illustrated in FIG. 16C is used as the photoelectric conversion layer. Here, the layer 567a is a cathode, and the layer 567e is an anode.

Insulating layers 651, 652, 653, and 654 and a conductive layer 655 are provided in the layer 561.

The insulating layers 651, 653, and 654 function as interlayer insulating films and planarization films. The insulating layer 654 is provided to cover an end portion of the photoelectric conversion device 101, and has a function of preventing a short circuit between the layer 567e and the layer 567a. The insulating layer 652 functions as an element isolation layer. An organic insulating film or the like is preferably used as the element isolation layer.

The layer 567a corresponding to the cathode of the photoelectric conversion device 101 is electrically connected to one of the source and the drain of the transistor 102 included in the layer 563a. The layer 567e corresponding to the anode of the photoelectric conversion device 101 is electrically connected to the conductive layer 636 included in the layer 563a through the conductive layer 655.

<Layer 560>

The layer 560 is formed over the layer 561. The layer 560 includes a light-blocking layer 671, an optical conversion layer 672, and a microlens array 673.

The light-blocking layer 671 can suppress entry of light into an adjacent pixel. As the light-blocking layer 671, a metal layer of aluminum, tungsten, or the like can be used. The metal layer and a dielectric film functioning as an anti-reflection film may be stacked.

Figure 23A:
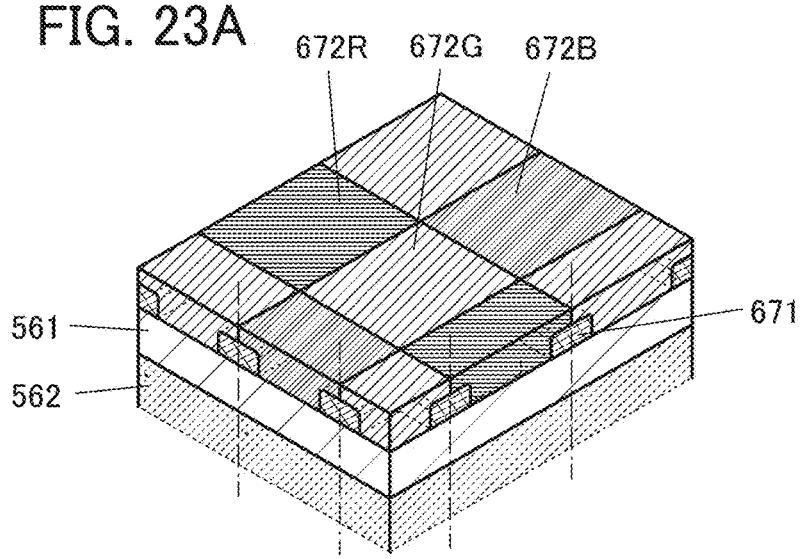
FIG. 23A to FIG. 23C are perspective views (cross-sectional views) illustrating a pixel.

When the photoelectric conversion device 101 has sensitivity to visible light, a color filter can be used as the optical conversion layer 672. When colors of R (red), G (green), B (blue), Y (yellow), C (cyan), M (magenta), and the like are assigned to the color filters of different pixels, a color image can be obtained. For example, as illustrated in a perspective view (including a cross section) of FIG. 23A, a color filter 672R (red), a color filter 672G (green), and a color filter 672B (blue) can be assigned to different pixels.

When a wavelength cut filter is used as the optical conversion layer 672 in the appropriate combination of the photoelectric conversion device 101 and the optical conversion layer 672, the imaging device can capture images in various wavelength regions.

For example, when an infrared filter that blocks light having a wavelength shorter than or equal to that of visible light is used as the optical conversion layer 672, an infrared imaging device can be obtained. When a filter that blocks light having a wavelength shorter than or equal to that of near infrared light is used as the optical conversion layer 672, a far-infrared imaging device can be obtained. When an ultraviolet filter that blocks light having a wavelength longer than or equal to that of visible light is used as the optical conversion layer 672, an ultraviolet imaging device can be obtained.

Figure 23B:
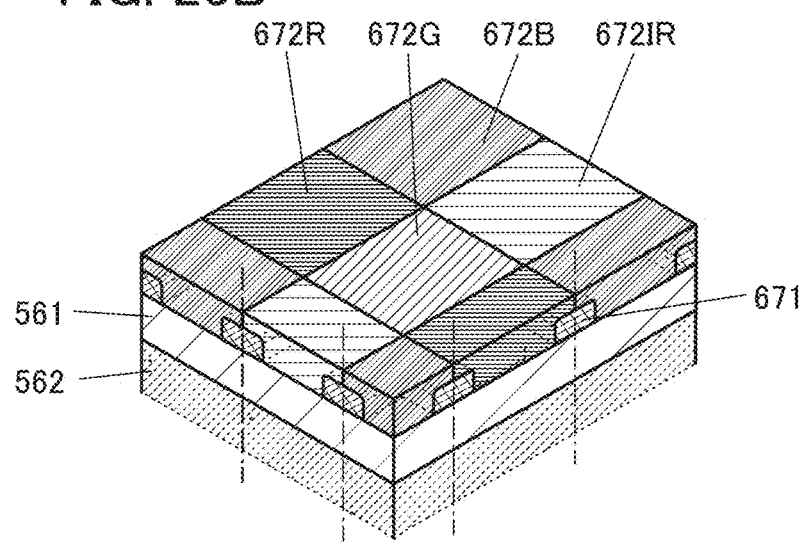

Note that different optical conversion layers may be provided in one imaging device. For example, as illustrated in FIG. 23B, the color filter 672R (red), the color filter 672G (green), the color filter 672B (blue), and an infrared filter 672IR can be assigned to different pixels. With this structure, a visible light image and an infrared light image can be obtained simultaneously.

Figure 23C:
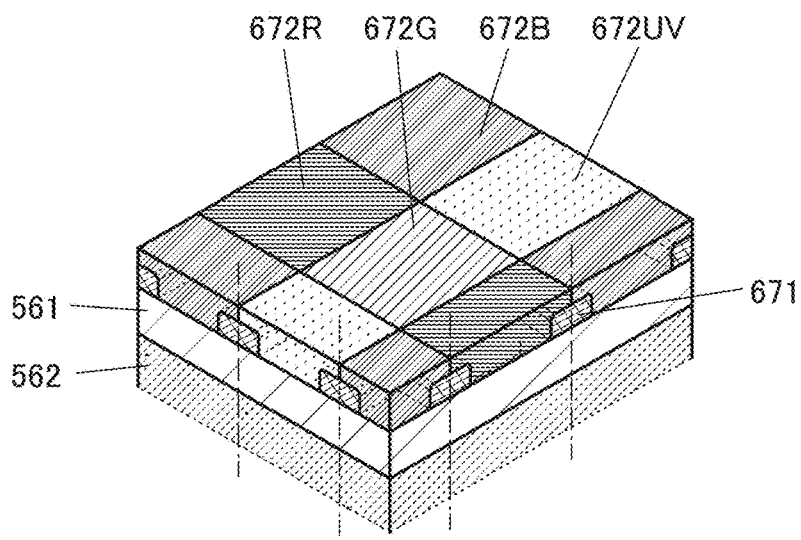

Alternatively, as illustrated in FIG. 23C, the color filter 672R (red), the color filter 672G (green), the color filter 672B (blue), and an ultraviolet filter 672UV can be assigned to different pixels. With this structure, a visible light image and an ultraviolet light image can be obtained simultaneously.

Furthermore, when a scintillator is used as the optical conversion layer 672, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed can be used.

Image capturing with the use of infrared light or ultraviolet light can provide the imaging device with an inspection function, a security function, a sensor function, or the like. For example, by image capturing with the use of infrared light, non-destructive inspection of products, sorting of agricultural products (e.g., sugar content meter function), vein authentication, metical inspection, or the like can be performed. Furthermore, by image capturing with the use of ultraviolet light, detection of ultraviolet light released from a light source or a frame can be performed, whereby a light source, a heat source, a production device, or the like can be controlled, for example.

The microlens array 673 is provided over the optical conversion layer 672. Light passing through an individual lens of the microlens array 673 goes through the optical conversion layer 672 directly under the lens, and the photoelectric conversion device 101 is irradiated with the light. With the microlens array 673, collected light can be incident on the photoelectric conversion device 101; thus, photoelectric conversion can be efficiently performed. The microlens array 673 is preferably formed using a resin, glass, or the like having a high light transmitting property with respect to light with an intended wavelength.

<Bonding>

Next, bonding of the layer 563b and the layer 563a will be described.

The insulating layer 618 and the conductive layer 619 are provided in the layer 563b. The conductive layer 619 includes a region embedded in the insulating layer 618. Furthermore, the surfaces of the insulating layer 618 and the conductive layer 619 are planarized to be level with each other.

The insulating layer 631 and the conductive layer 639 are provided in the layer 563a. The conductive layer 639 includes a region embedded in the insulating layer 631. Furthermore, the surfaces of the insulating layer 631 and the conductive layer 639 are planarized to be level with each other.

Here, a main component of the conductive layer 619 and a main component of the conductive layer 639 are preferably the same metal element. Furthermore, the insulating layer 618 and the insulating layer 631 are preferably formed of the same component.

For the conductive layers 619 and 639, Cu, Al, Sn, Zn, W, Ag, Pt, or Au can be used, for example. Preferably, Cu, Al, W, or Au is used for easy bonding. In addition, for the insulating layers 618 and 631, silicon oxide, silicon oxynitride, silicon nitride oxide, silicon nitride, titanium nitride, or the like can be used.

That is, the same metal material described above is preferably used for the conductive layer 619 and the conductive layer 639. Furthermore, the same insulating material described above is preferably used for the insulating layer 618 and the insulating layer 631. With this structure, bonding can be performed at the boundary between the layer 563b and the layer 563a.

Note that the conductive layer 619 and the conductive layer 639 may each have a multilayer structure of a plurality of layers; in that case, the outer layers (bonding surfaces) are formed of the same metal material. The insulating layer 618 and the insulating layer 631 may each have a multilayer structure of a plurality of layers; in that case, the outer layers (bonding surfaces) are formed of the same insulating material.

Through the above bonding, the electrical connection between the conductive layer 619 and the conductive layer 639 can be obtained. Moreover, the connection between the insulating layer 618 and the insulating layer 631 with mechanical strength can be obtained.

For bonding metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 563b and the layer 563a are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The above bonding allows the circuit 201 included in the layer 563b to be electrically connected to the components of the pixel 100 included in the layer 563a.

<Modification Example of Stacked-Layer Structure 1>

Figure 19:
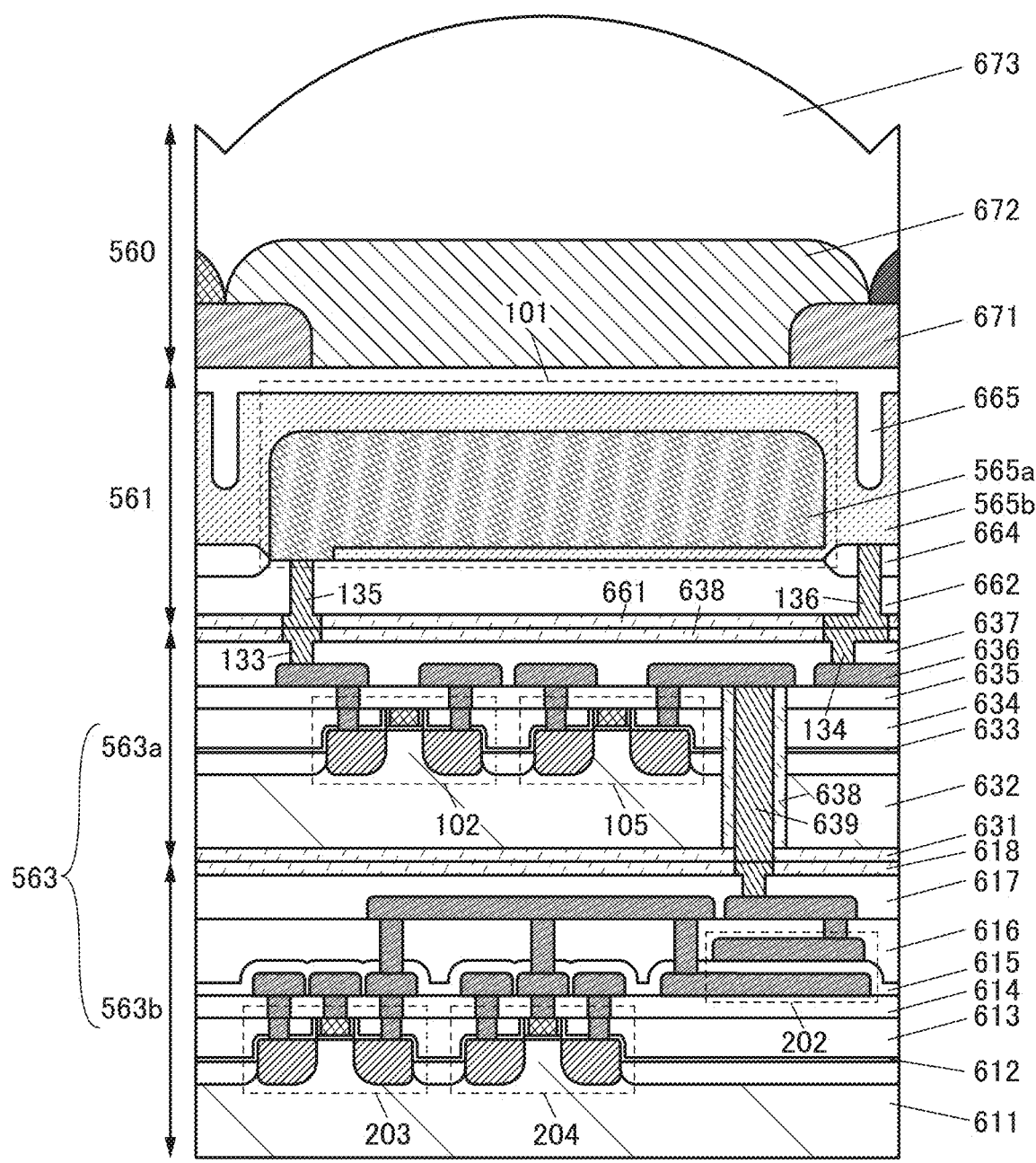
FIG. 19 is a cross-sectional view illustrating a pixel.

FIG. 19 is a modification example of the stacked-layer structure illustrated in FIG. 17 and differs from FIG. 17 in the structure of the photoelectric conversion device 101 included in the layer 561 and part of the structure of the layer 563a; a bonding surface is also included between the layer 561 and the layer 563a.

The layer 561 includes the photoelectric conversion device 101, insulating layers 661, 662, 664, and 665, and conductive layers 135 and 136.

The photoelectric conversion device 101 is a pn junction photodiode and includes the layer 565b corresponding to a p-type region and the layer 565a corresponding to an n-type region.

Note that an example where a pn junction photodiode is formed over a silicon substrate is described here. The photoelectric conversion device 101 is a pinned photodiode, which can suppress a dark current and reduce noise with the thin p-type region (part of the layer 565b) provided on the surface side (current extraction side) of the layer 565a.

The insulating layer 661 and the conductive layers 135 and 136 function as bonding layers. The insulating layer 662 functions as an interlayer insulating film and a planarization film. The insulating layer 664 functions as an element isolation layer. The insulating layer 665 has a function of suppressing carrier leakage.

The silicon substrate is provided with a groove that separates pixels, and the insulating layer 665 is provided on the top surface of the silicon substrate and in the groove. The insulating layer 665 can suppress leakage of carriers generated in the photoelectric conversion device 101 to an adjacent pixel. The insulating layer 665 also has a function of suppressing entry of stray light. Therefore, color mixture can be suppressed with the insulating layer 665. Note that an anti-reflection film may be provided between the top surface of the silicon substrate and the insulating layer 665.

The element isolation layer can be formed by a LOCOS (LOCal Oxidation of Silicon) method. Alternatively, an STI (Shallow Trench Isolation) method or the like may be used to form the element isolation layer. As the insulating layer 665, for example, an inorganic insulating film of silicon oxide, silicon nitride, or the like or an organic insulating film of polyimide, acrylic, or the like can be used. The insulating layer 665 may have a multilayer structure.

The layer 565a (corresponding to the n-type region and the cathode) of the photoelectric conversion device 101 is electrically connected to the conductive layer 135. The layer 565b (corresponding to the p-type region and the anode) is electrically connected to the conductive layer 136. The conductive layers 135 and 136 each include a region embedded in the insulating layer 661. Furthermore, the surfaces of the insulating layer 661 and the conductive layers 135 and 136 are planarized to be level with each other.

In the layer 563a, the insulating layer 638 is formed over the insulating layer 637. In addition, a conductive layer 133 electrically connected to one of the source and the drain of the transistor 102 and a conductive layer 134 electrically connected to the conductive layer 636 are formed.

The insulating layer 638 and the conductive layers 133 and 134 function as bonding layers. The conductive layers 133 and 134 each include a region embedded in the insulating layer 638. Furthermore, the surfaces of the insulating layer 638 and the conductive layers 133 and 134 are planarized to be level with each other.

Here, the conductive layers 133, 134, 135, and 136 are the same bonding layers as the above-described conductive layers 619 and 639. The insulating layers 638 and 661 are the same bonding layers as the above-described insulating layers 618 and 631.

Thus, when the conductive layer 133 and the conductive layer 135 are bonded to each other, the layer 565a (corresponding to the n-type region and the cathode) of the photoelectric conversion device can be electrically connected to the one of the source and the drain of the transistor 102. In addition, when the conductive layer 134 and the conductive layer 136 are bonded to each other, the layer 565b (corresponding to the p-type region and the anode) of the photoelectric conversion device can be electrically connected to the wiring 114 (see FIG. 3A). When the insulating layer 638 and the insulating layer 661 are bonded to each other, electrical bonding and mechanical bonding of the layer 561 and the layer 563a can be performed.

<Stacked-Layer Structure 2>

Figure 20:
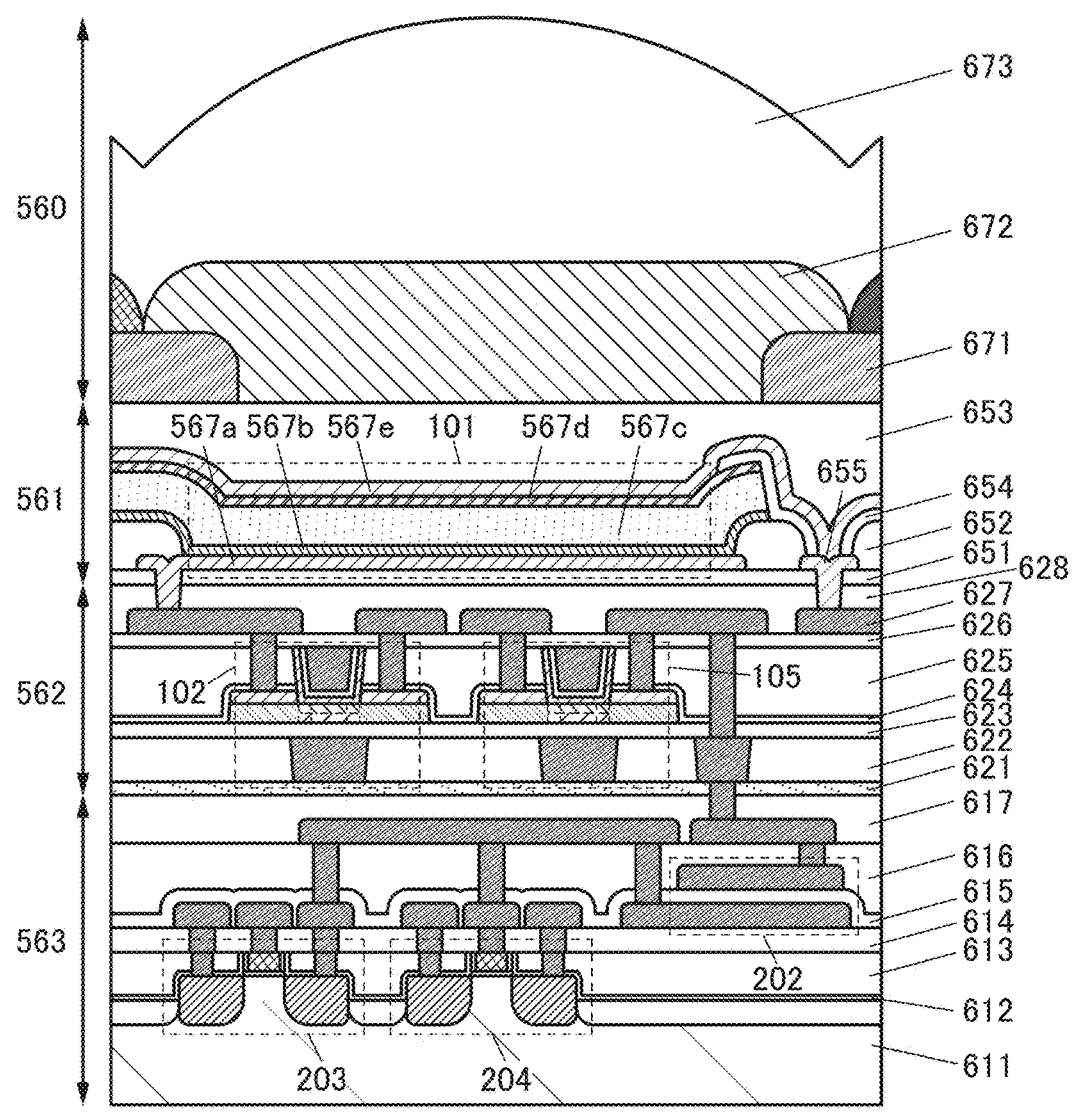
FIG. 20 is a cross-sectional view illustrating a pixel.

FIG. 20 is an example of a cross-sectional view of a stack including the layers 560, 561, 562, and 563 and not including a bonding surface. Si transistors are provided in the layer 563. OS transistors are provided in the layer 562. Note that the structures of the layer 563, the layer 561, and the layer 560 are not described here because they are the same as the structures of the layer 563b, the layer 561, and the layer 560 illustrated in FIG. 17.

<Layer 562>

The layer 562 is formed over the layer 563. The layer 562 includes OS transistors. Here, the transistor 102 and the transistor 105 are illustrated as part of components of the pixel 100. In the cross-sectional view illustrated in FIG. 20, electrical connection between the transistors is not illustrated.

Insulating layers 621, 622, 623, 624, 625, 626, and 628 are provided in the layer 562. Moreover, a conductive layer 627 is provided. The conductive layer 627 can be electrically connected to the wiring 114 (see FIG. 3A).

The insulating layer 621 functions as a blocking layer. The insulating layers 622, 623, 625, 626, and 628 function as interlayer insulating films and planarization films. The insulating layer 624 has a function of a protective film.

As the blocking layer, a film that has a function of preventing hydrogen diffusion is preferably used. In a Si device, hydrogen is necessary to terminate dangling bonds; however, hydrogen in the vicinity of an OS transistor is one factor of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

The other of the source and the drain of the transistor 105 is electrically connected to the one electrode of the capacitor 202 through a plug. Furthermore, the conductive layer 627 is electrically connected to the wiring 114 (see FIG. 3A).

The one of the source and the drain of the transistor 102 is electrically connected to the cathode of the photoelectric conversion device 101 included in the layer 561. The conductive layer 627 is electrically connected to the anode of the photoelectric conversion device 101 included in the layer 561.

Figure 21A:
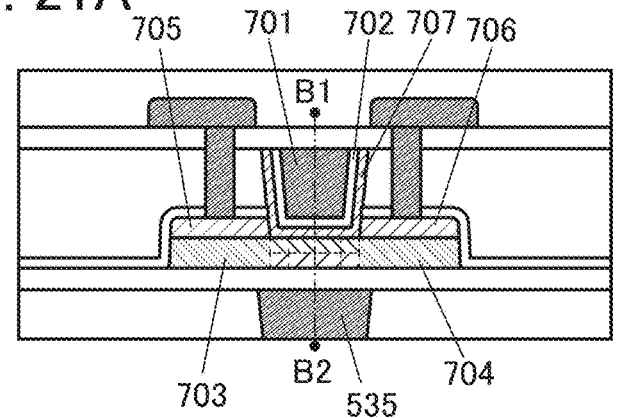
FIG. 21A to FIG. 21D are diagrams illustrating OS transistors.

The details of an OS transistor are illustrated in FIG. 21A. The OS transistor illustrated in FIG. 21A has a self-aligned structure in which a source electrode 705 and a drain electrode 706 are formed through provision of an insulating layer over stacked layers of an oxide semiconductor layer and a conductive layer and provision of opening portions reaching the oxide semiconductor layer.

The OS transistor can include a gate electrode 701 and a gate insulating film 702 in addition to a channel formation region, a source region 703, and a drain region 704, which are formed in the oxide semiconductor layer. At least the gate insulating film 702 and the gate electrode 701 are provided in the opening portion. The opening portion may further be provided with an oxide semiconductor layer 707.

Figure 21B:
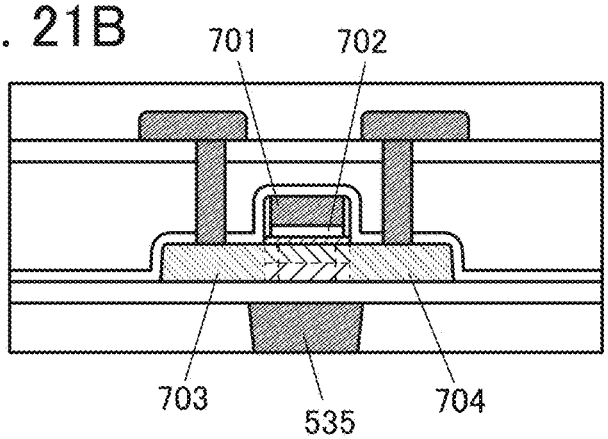

As illustrated in FIG. 21B, the OS transistor may have a self-aligned structure in which the source region 703 and the drain region 704 are formed in the semiconductor layer with the gate electrode 701 as a mask.

Figure 21C:
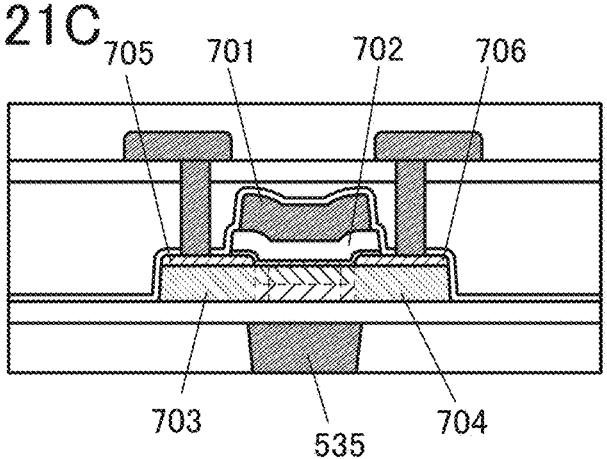

As illustrated in FIG. 21C, the OS transistor may be anon-self-aligned top-gate transistor including a region where the source electrode 705 or the drain electrode 706 overlaps with the gate electrode 701.

Figure 21D:
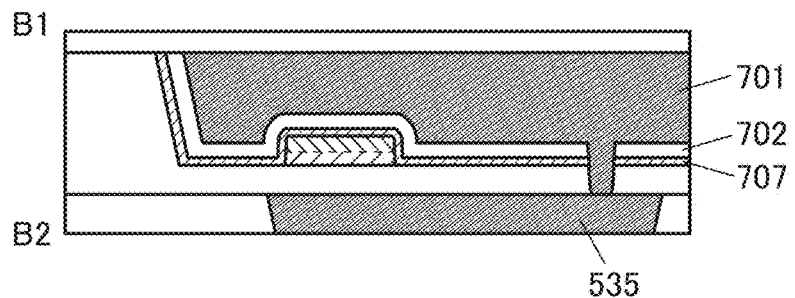

Although the OS transistor has a structure with a back gate 535, it may have a structure without a back gate. As illustrated in a cross-sectional view of the transistor in the channel width direction in FIG. 21D, the back gate 535 may be electrically connected to a front gate of the transistor, which is provided to face the back gate. Note that FIG. 21D illustrates an example of a B1-B2 cross section of the transistor in FIG. 21A, and the same applies to a transistor having any of the other structures. A structure where a fixed potential different from the potential supplied to the front gate is supplied to the back gate 535 may be employed.

<Modification Example of Stacked-Layer Structure 2>

Figure 22:
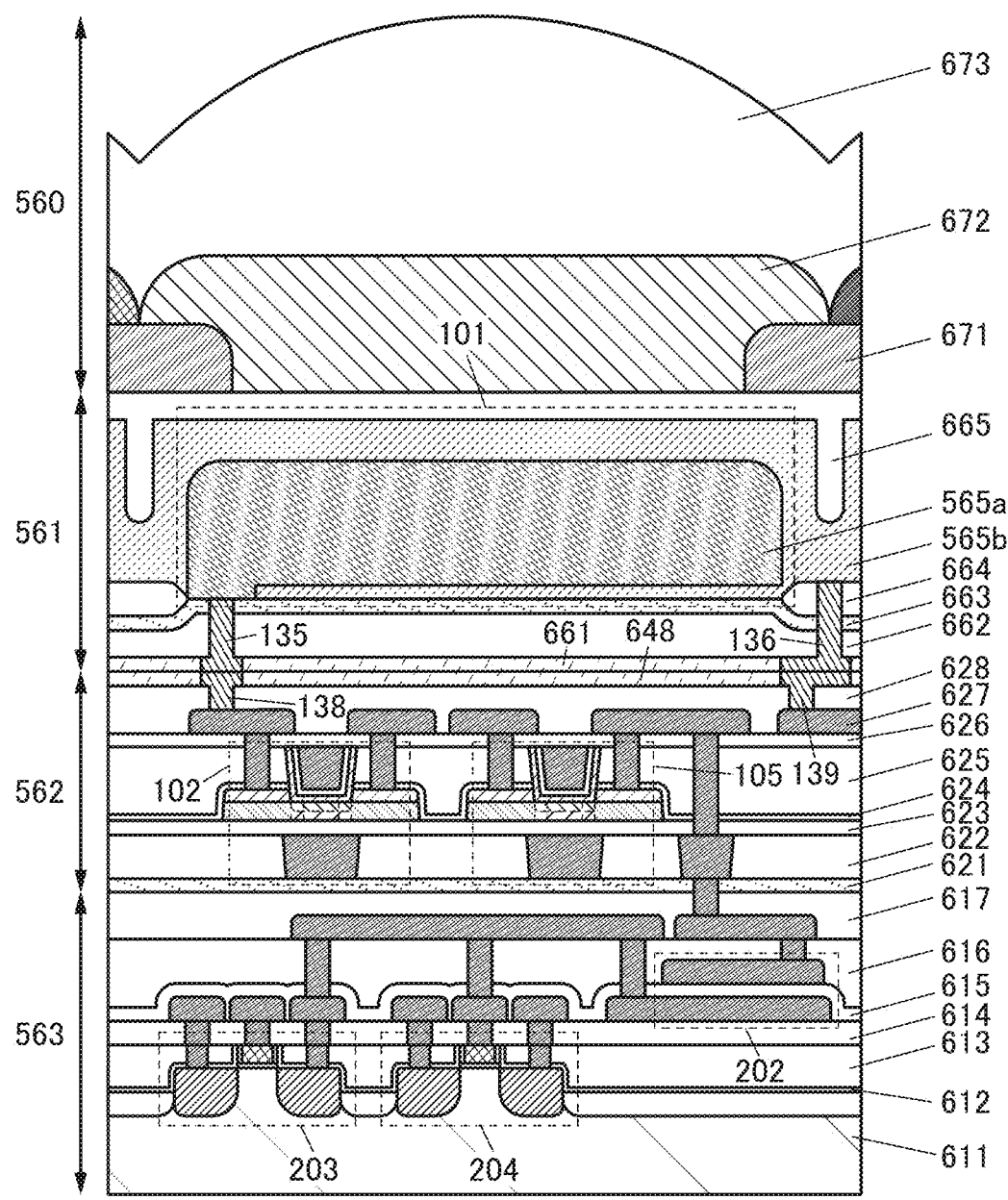
FIG. 22 is a cross-sectional view illustrating a pixel.

FIG. 22 is a modification example of the stacked-layer structure illustrated in FIG. 20 and differs from FIG. 20 in the structure of the photoelectric conversion device 101 included in the layer 561 and part of the structure of the layer 562; a bonding surface is included between the layer 561 and the layer 562.

The photoelectric conversion device 101 included in the layer 561 is a pn junction photodiode and has a structure similar to that illustrated in FIG. 19.

In the layer 562, an insulating layer 648 is formed over the insulating layer 628. In addition, a conductive layer 138 electrically connected to the one of the source and the drain of the transistor 102 and a conductive layer 139 electrically connected to the conductive layer 627 are formed.

The insulating layer 648 and the conductive layers 138 and 139 function as bonding layers. The conductive layers 138 and 139 each include a region embedded in the insulating layer 648. Furthermore, the surfaces of the insulating layer 648 and the conductive layers 138 and 139 are planarized to be level with each other.

Here, the conductive layers 138 and 139 are the same bonding layers as the above-described conductive layers 619 and 639. The insulating layer 648 is the same bonding layer as the above-described insulating layers 618 and 631.

Thus, when the conductive layer 138 and the conductive layer 135 are bonded to each other, the layer 565a (corresponding to the n-type region and the cathode) of the photoelectric conversion device can be electrically connected to the one of the source and the drain of the transistor 102. In addition, when the conductive layer 139 and the conductive layer 136 are bonded to each other, the layer 565b (corresponding to the p-type region and the anode) of the photoelectric conversion device can be electrically connected to the wiring 114 (see FIG. 3A).

When the insulating layer 648 and the insulating layer 661 are bonded to each other, electrical bonding and mechanical bonding of the layer 561 and the layer 562 can be performed.

In the case where a plurality of Si devices are stacked, a polishing step and a bonding step are required to be performed a plurality of times. Consequently, there are issues such as a large number of manufacturing steps, the need for a dedicated apparatus, and a low yield, and the manufacturing cost is high. An OS transistor can be formed to be stacked over a semiconductor substrate on which a device is formed, and thus a bonding step can be skipped.

<Package, Module>

FIG. 24A1 is an external perspective view of the top surface side of a package in which an image sensor chip is placed. The package includes a package substrate 410 to which an image sensor chip 450 (see FIG. 24A3) is fixed, a cover glass 420, an adhesive 430 for bonding them, and the like.

FIG. 24A2 is an external perspective view of the bottom surface side of the package. A BGA (Ball Grid Array) in which solder balls are used as bumps 440 on the bottom surface of the package is employed. Note that, other than the BGA, an LGA (Land Grid Array), a PGA (Pin Grid Array), or the like may be employed.

FIG. 24A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 24B1 is an external perspective view of the top surface side of a camera module in which an image sensor chip is placed in a package with a built-in lens. The camera module includes a package substrate 411 to which an image sensor chip 451 (see FIG. 24B3) is fixed, a lens cover 421, a lens 435, and the like. Furthermore, an IC chip 490 (see FIG. 24B3) having functions of a driver circuit, a signal conversion circuit, and the like of an imaging device is provided between the package substrate 411 and the image sensor chip 451; thus, the structure as an SiP (System in package) is included.

FIG. 24B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 24B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above-described form can be easily mounted on a printed substrate or the like, and the image sensor chip can be incorporated in a variety of semiconductor devices and electronic devices.

This embodiment can be combined with the other embodiments as appropriate.

Embodiment 3

As electronic devices that can use the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 25A to FIG. 25F illustrate specific examples of these electronic devices.

Figure 25A:
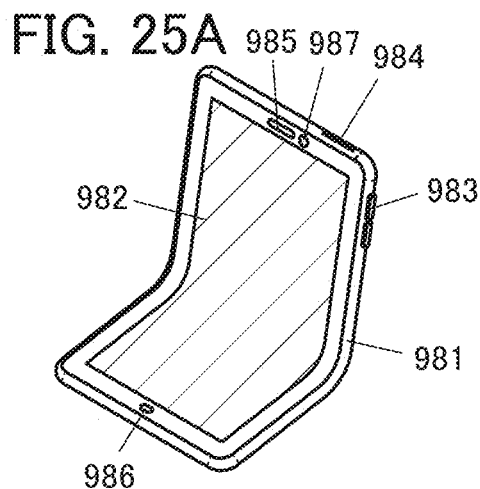
FIG. 25A to FIG. 25F are diagrams illustrating electronic devices.

FIG. 25A is an example of a mobile phone, which includes a housing 981, a display portion 982, an operation button 983, an external connection port 984, a speaker 985, a microphone 986, a camera 987, and the like. The display portion 982 of the mobile phone is provided with a touch sensor. A variety of operations such as making a call and inputting text can be performed by touch on the display portion 982 with a finger, a stylus, or the like. The imaging device of one embodiment of the present invention and the operation method thereof can be used in the mobile phone.

Figure 25B:
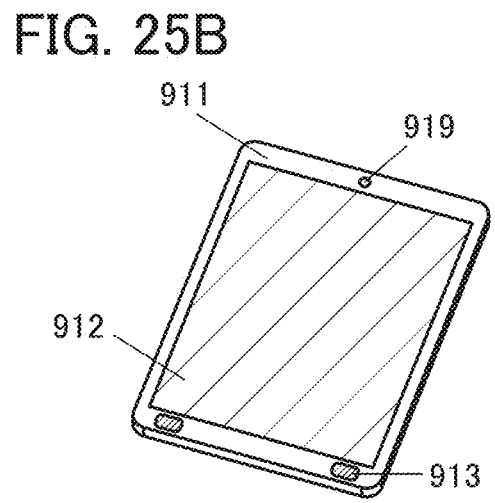

FIG. 25B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used in the portable data terminal.

Figure 25C:
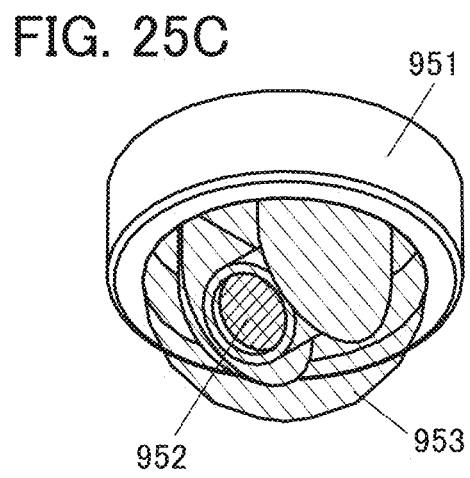

FIG. 25C is a surveillance camera, which includes a support base 951, a camera unit 952, a protection cover 953, and the like. By setting the camera unit 952 provided with a rotating mechanism and the like on a ceiling, an image of all of the surroundings can be taken. The imaging device of one embodiment of the present invention and the operation method thereof can be used for obtaining an image in the camera unit. Note that a surveillance camera is a name in common use and does not limit the use thereof. A device that has a function of a surveillance camera can also be called a camera or a video camera, for example.

Figure 25D:
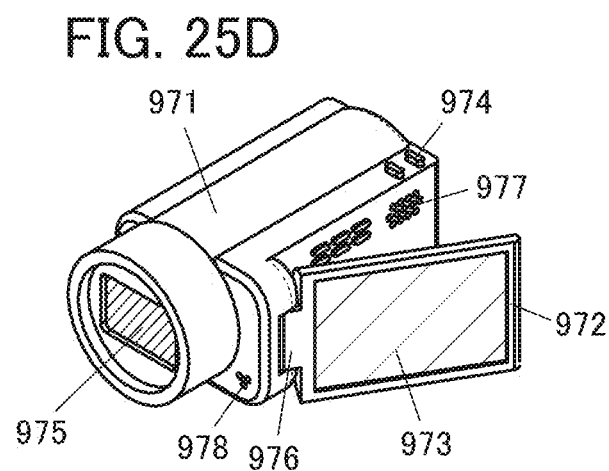

FIG. 25D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used in the video camera.

Figure 25E:
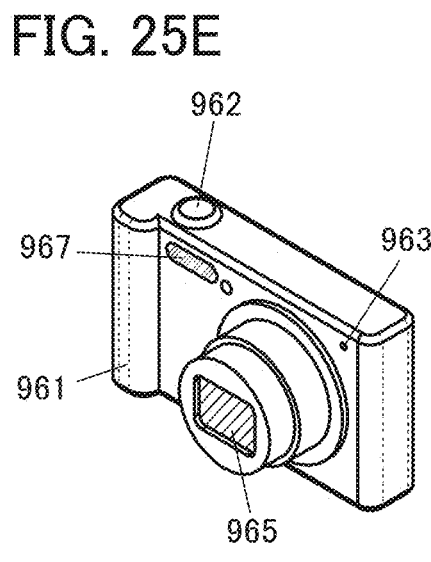

FIG. 25E is a digital camera, which includes a housing 961, a shutter button 962, a microphone 963, a light-emitting portion 967, a lens 965, and the like. The imaging device of one embodiment of the present invention and the operation method thereof can be used in the digital camera.

Figure 25F:
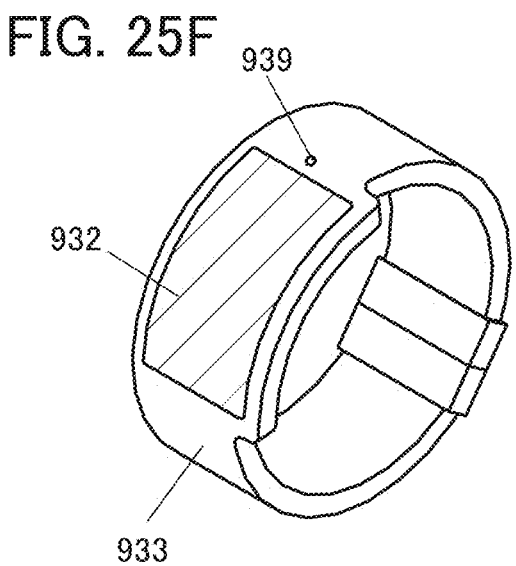

FIG. 25F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used in the information terminal.

Figure 26:
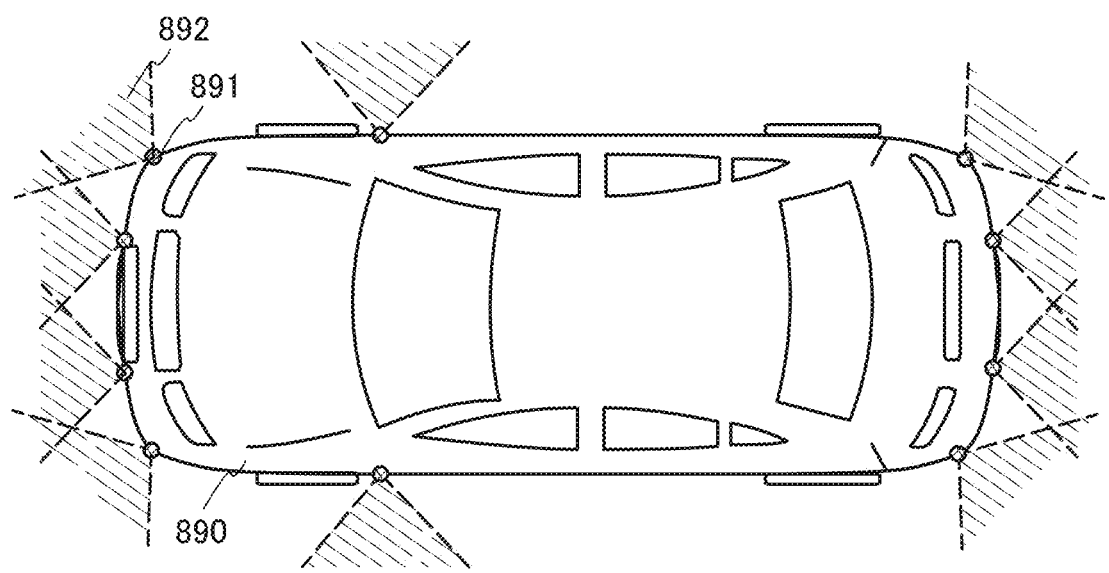
FIG. 26 is a diagram illustrating an automobile.

FIG. 26 illustrates an external view of an automobile as an example of a moving object. An automobile 890 includes a plurality of cameras 891 and the like. The imaging device of one embodiment of the present invention and the operation method thereof can be used in the cameras 891. The automobile 890 is also provided with various sensors such as an infrared radar, a millimeter wave radar, and a laser radar (not illustrated) and the like.

The automobile 890 judges traffic conditions therearound such as the presence of a guardrail or a pedestrian by analyzing images in a plurality of image capturing directions 892 taken by the cameras 891, and thus can perform autonomous driving. The cameras 891 can be used in a system for navigation, risk prediction, or the like.

When arithmetic processing with a neural network or the like is performed on the obtained image data in the imaging device of one embodiment of the present invention, for example, processing such as an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and reduction of glare and reflection can be performed.

Note that an automobile is described above as an example of a moving object and may be any of an automobile having an internal-combustion engine, an electric vehicle, a hydrogen vehicle, and the like. Furthermore, the moving object is not limited to an automobile. Examples of moving objects include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

This embodiment can be combined with the other embodiments as appropriate.

Embodiment 4

An imaging device suitable for a vehicle that performs semi-autonomous driving is provided by using the circuit according to Embodiment 1 or the imaging device according to Embodiment 2.

In Japan, the automation level of the driving system for vehicles such as automobiles is defined in four levels, from Level 1 to Level 4. Level 1 allows any of acceleration, steering, and braking to be automated and is called driving safety support systems. Level 2 allows a plurality of operations among acceleration, steering, and braking to be automated at the same time and is called semi-autonomous driving systems (also referred to as semi-autonomous driving). Level 3 allows all of acceleration, steering, and braking to be automated, where a driver handles driving only in case of emergency, and is also called semi-autonomous driving systems (also referred to as semi-autonomous driving). Level 4 allows all of acceleration, steering, and braking to be automated and is called fully autonomous driving where a driver is rarely in charge of driving.

In this embodiment, a novel structure and a novel system mainly premised on semi-autonomous driving in Level 2 or Level 3 are proposed.

In order to display warnings notifying a driver of the danger in accordance with the circumstances obtained from a variety of cameras and sensors, the area of a display region adequate for the number of cameras and the number of sensors is necessary.

Figure 27A:
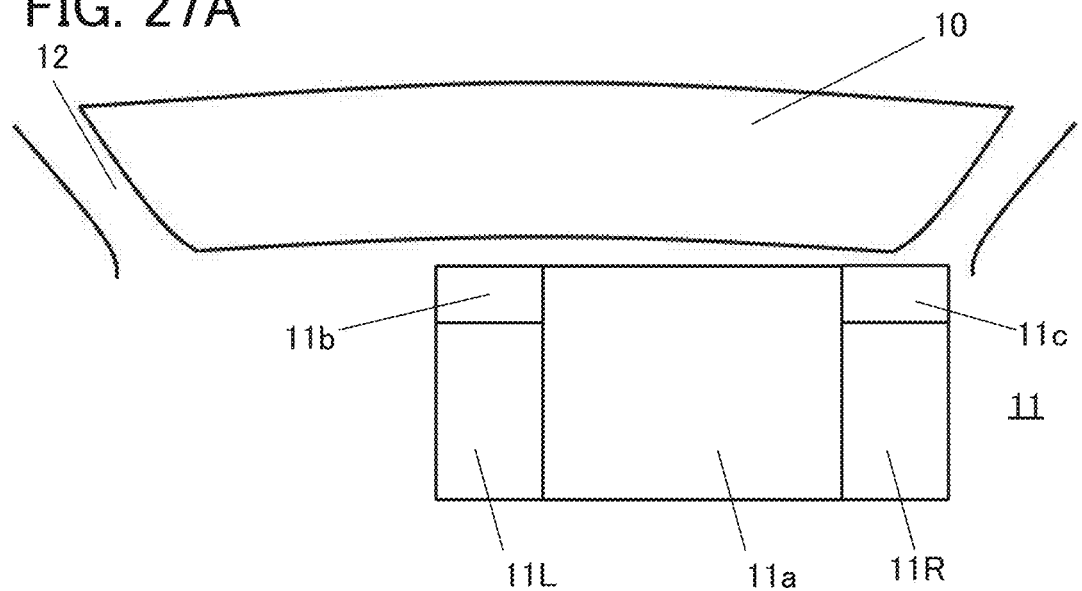
FIG. 27A is a schematic diagram illustrating the field of front view of a driver seen from the inside of a vehicle.
Figure 27B:
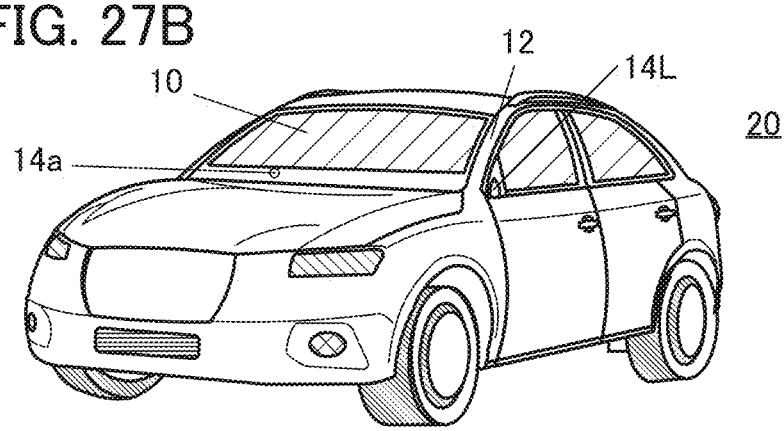
FIG. 27B is a diagram illustrating the exterior of the vehicle.

FIG. 27A is a schematic diagram illustrating the field of front view of a driver seen from the inside of a vehicle. A windshield 10 is positioned in an upper part of the field of view of the driver, and a display device 11 having a display screen is provided in a lower part of the field of view. Note that the windshield 10 is sandwiched between pillars 12. Furthermore, FIG. 27B illustrates an exterior view of a vehicle 20.

The driver mainly looks at the display device 11 to perform acceleration, steering, and braking and checks the outside of the vehicle from the windshield as an aid. As the display device 11, any one of a liquid crystal display device, an EL (Electro Luminescence) display device, and a micro LED (Light Emitting Diode) display device is used. Here, an LED chip whose one side size is larger than 1 mm is called a macro LED, an LED chip whose one side size is larger than 100 µm and smaller than or equal to 1 mm is called a mini LED, and an LED chip whose one side size is smaller than or equal to 100 µm is called a micro LED. It is particularly preferable to use a micro LED as an LED element applied to the pixel. The use of a micro LED can achieve an extremely high-resolution display device. The display device 11 preferably has higher resolution.

The pixel density of the display device 11 can be higher than or equal to 100 ppi and lower than or equal to 5000 ppi, preferably higher than or equal to 200 ppi and lower than or equal to 2000 ppi.

For example, a center part 11*a* of the display screen of the display device displays an image obtained from an imaging device provided at the front outside the vehicle. Furthermore, parts 11*b* and 11*c* of the display screen perform meter display such as the display of the speed, the estimated distance to empty, and the abnormality warning. An image of the left side outside the vehicle is displayed in a lower left part 11L of the display screen, and an image of the right side outside the vehicle is displayed on a lower right part 11R of the display screen.

The lower left part 11L of the display screen and the lower right part 11R of the display screen can eliminate sideview mirror protrusions that protrude greatly outside the vehicle by electronization of sideview mirrors (also referred to as door mirrors).

The display screen of the display device 11 may be configured to be operated by touch input so that part of an image is enlarged or reduced, the display position is changed, or the area of the display region is expanded, for example.

Figure 28:
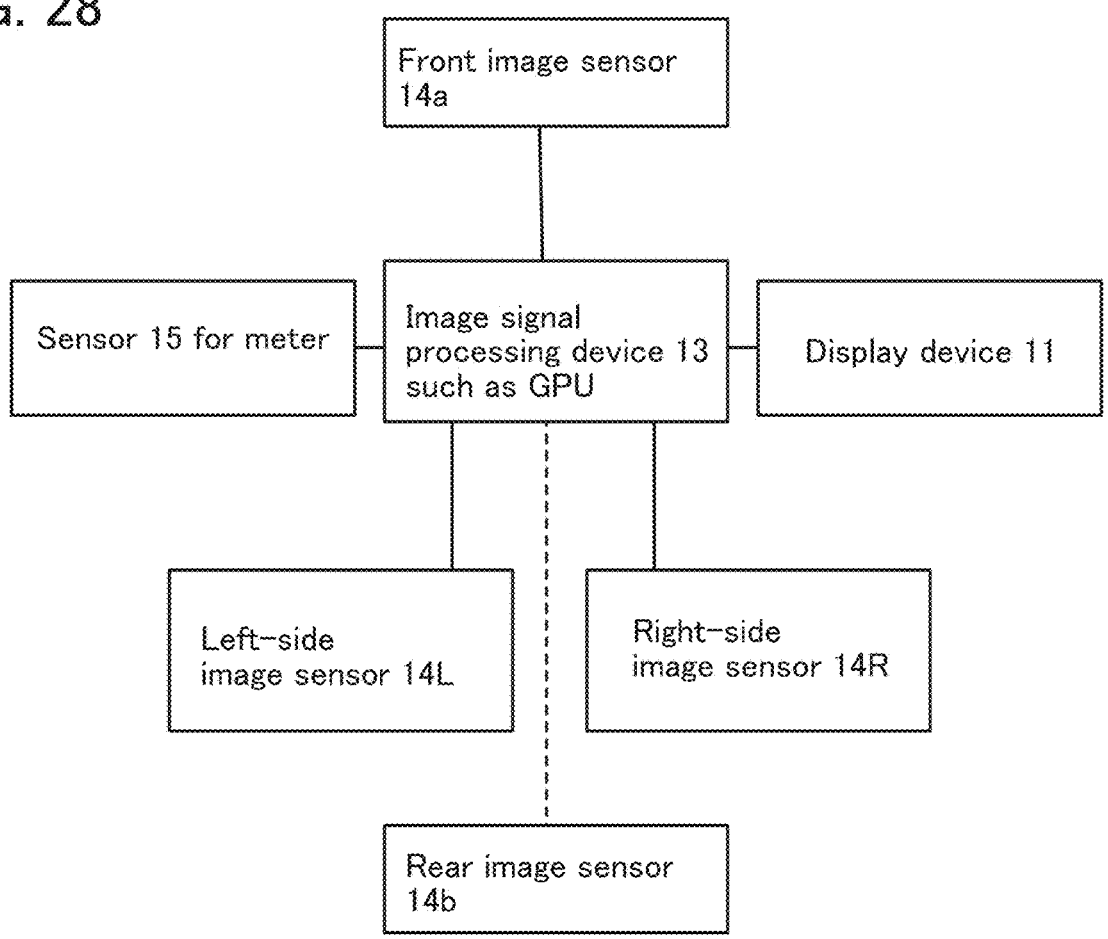
FIG. 28 is a diagram illustrating an example of a block diagram of a display system.

Furthermore, FIG. 28 illustrates an example of a block diagram of a display system including the display device 11.

Because an image on the display screen of the display device 11 is a composite of data from a plurality of imaging devices and sensors, the image is created with an image signal processing device 13 such as a GPU.

The image signal processing device 13 can perform parallel processing of signals from the plurality of imaging devices and sensors.

In FIG. 28, the image signal processing device 13 is electrically connected to a front image sensor 14*a*, a rear image sensor 14*b*, a left-side image sensor 14L, and a right-side image sensor 14R. Note that FIG. 27B also illustrates examples of the positions where the front image sensor 14*a* and the left-side image sensor 14L are provided. Although an example where the front image sensor 14*a* is provided in a position close to the driver's line of sight is illustrated in FIG. 27B, without particular limitation, the front image sensor 14*a* may be provided on a front grille or a front bumper. Furthermore, although an example of a right-hand-drive vehicle is illustrated in this embodiment, there is no particular limitation. In the case of a left-hand-drive vehicle, the front image sensor 14*a* may be provided in accordance with the position of the driver.

The image sensor chip described in Embodiment 2 is preferably used as at least one of these image sensors.

Moreover, the image signal processing device 13 is electrically connected to a sensor 15 for a meter in the illustrated example; however, the structure is not limited to this. A structure where the image signal processing device 13 is further electrically connected to a plurality of sensors such as a temperature sensor, an acceleration sensor, and a battery gauge, for example, may be employed.

Figure 29:
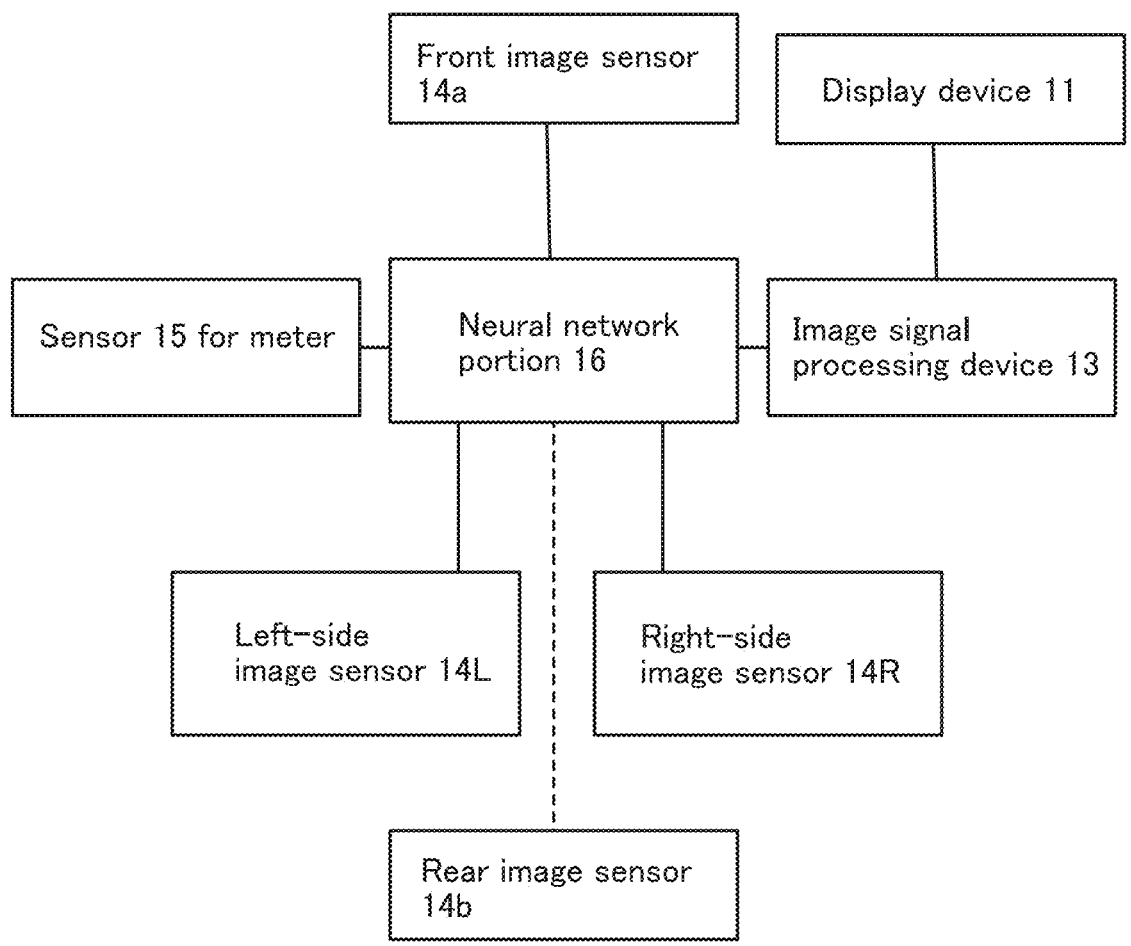
FIG. 29 is a diagram illustrating an example of a block diagram of a system.

FIG. 28 illustrates an example of a display system. To provide more information to a driver and enable semi-autonomous driving, FIG. 29 illustrates a block diagram of a novel system that utilizes AI (Artificial Intelligence). Note that in FIG. 29, the components that are the same as those in FIG. 28 are denoted by the same reference numerals.

In FIG. 29, a neural network portion 16 is electrically connected to the front image sensor 14*a*, the rear image sensor 14*b*, the left-side image sensor 14L, and the right-side image sensor 14R. Furthermore, the sensor 15 for a meter is also electrically connected to the neural network portion 16.

The neural network portion 16 is electrically connected to the display device 11 through the image signal processing device 13.

With the system illustrated in FIG. 29, an object and the background in an image can be separately extracted, whereby motion recognition, by which the movement of the object is detected, can be made practical, for example.

For example, a black and white image with a wide dynamic range is obtained using an image sensor without a color filter, and colored using the neural network portion 16, so that a clear image can be created and displayed on the display device 11. For example, an image from which a dark figure of a person in a tunnel can be recognized can be created.

Furthermore, segmentation can also be performed using the neural network portion 16. Note that segmentation refers to processing for identifying what object each pixel of an input image represents. This is also referred to as semantic segmentation. The neural network portion 16 executes software for generating a plurality of image segments for use in image analysis. Specifically, segmentation is performed on the basis of the learned content by using U-net that is one kind of image processing and convolutional neural network (CNN).

Figure 30A:
FIG. 30A and FIG. 30C are photographs and FIG. 30B and FIG. 30D are data.
Figure 30B:

An image taken with a CMOS sensor is shown in FIG. 30A, and an example of the image subjected to segmentation using the neural network portion 16 is illustrated in FIG. 30B. Note that the segmentation labels are distinguished by vehicle, sky, plant, ground, and the like. Actually, in FIG. 30B, color-coding into pink, light blue, green, and gray is performed according to the distance. In FIG. 30B, at least a car can be recognized.

Figure 30C:
Figure 30D:

Furthermore, an image taken with a CMOS sensor is illustrated in FIG. 30C, and an example of the image subjected to depth estimation using the neural network portion 16 is illustrated in FIG. 30D. The results in FIG. 30D were obtained using known depth estimation software. Actually, in FIG. 30D, color-coding into blue, light blue, yellow, and red is performed according to the distance.

Furthermore, an image taken with a CMOS sensor is illustrated in FIG. 31A, and an example of the image subjected to contour extraction using the neural network portion 16 is illustrated in FIG. 31B.

By appropriately using one or more of these methods utilizing the AI, the driver can mainly look at a displayed image on the display device, that is, an image obtained by utilizing the image sensors and the AI in operating the vehicle and look at the front of the windshield as an aid. Operating the vehicle while looking at images obtained by utilizing the AI, rather than driving with only the driver's eyes, can be safe driving. Moreover, the driver can operate the vehicle with a sense of security.

Note that the display device can be used around the driver's seat (also referred to as a cockpit portion) in various types of vehicles such as a large-sized vehicle, a middle-sized vehicle, and a small-sized vehicle. Furthermore, the display device can also be used around the driver's seat in a vehicle such as an airplane or a ship.

Furthermore, when the circuit of Embodiment 1 and the imaging device of Embodiment 2 are used as the imaging device, they can perform part of the AI operation. Moreover, when the circuit of Embodiment 1 and the imaging device of Embodiment 2 are used, colorization of a black and white image, luminance leveling, selective sensing, quantification of the degree of depth, conversion into a natural image, a process of adjusting the focus in a wide range, extraction of a partial display, composition of an intermediate image of a plurality of images, and the like become possible.

Although the image signal processing device 13 and the neural network portion 16 are separately illustrated in FIG. 29, there is no particular limitation and they may be formed as one unit.

Furthermore, a transistor using an oxide semiconductor (OS transistor) may be used in part of the image signal processing device 13 and part of the neural network portion 16. The use of the OS transistor can further reduce power consumption.

This embodiment can be freely combined with the other embodiments.

REFERENCE NUMERALS

10: windshield, 11: display device, 11a: center part, 11b: part, 11c: part, 11L: lower left part, 11R: lower right part, 12: pillar, 13: image signal processing device, 14a: front image sensor, 14b: rear image sensor, 14L: left-side image sensor, 14R: right-side image sensor, 15: sensor for a meter, 16: neural network portion, 20: vehicle, 100: pixel, 101: photoelectric conversion device, 102: transistor, 103: transistor, 104: transistor, 105: transistor, 106: transistor, 107: capacitor, 111: wiring, 112: wiring, 113: wiring, 113a: wiring, 113b: wiring, 113c: wiring, 113d: wiring, 113e: wiring, 113f: wiring, 113g: wiring, 113h: wiring, 113i: wiring, 113j: wiring, 114: wiring, 115: wiring, 117: wiring, 121: wiring, 122: wiring, 123: wiring, 124: wiring, 133: conductive layer, 134: conductive layer, 135: conductive layer, 136: conductive layer, 138: conductive layer, 139: conductive layer, 150: transistor, 150a: transistor, 150b: transistor, 150c: transistor, 150d: transistor, 150e: transistor, 150f: transistor, 150g: transistor, 150h: transistor, 150i: transistor, 150j: transistor, 161: transistor, 162: transistor, 163: capacitor, 170: circuit, 200: pixel block, 201: circuit, 202: capacitor, 203: transistor, 204: transistor, 205: transistor, 206: transistor, 207: resistor, 211: wiring, 212: wiring, 213: wiring, 215: wiring, 216: wiring, 217: wiring, 218: wiring, 219: wiring, 300: pixel array, 301: circuit, 302: circuit, 303: circuit, 304: circuit, 305: circuit, 306: circuit, 311: wiring, 320: memory cell, 325: reference memory cell, 330: circuit, 350: circuit, 360: circuit, 370: circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 535: back gate, 545: semiconductor layer, 546: insulating layer, 560: layer, 561: layer, 562: layer, 562a: layer, 562b: layer, 563: layer, 563a: layer, 563b: layer, 563c: layer, 565a: layer, 565b: layer, 566a: layer, 566b: layer, 566c: layer, 566d: layer, 567a: layer, 567b: layer, 567c: layer, 567d: layer, 567e: layer, 611: silicon substrate, 612: insulating layer, 613: insulating layer, 614: insulating layer, 615: insulating layer, 616: insulating layer, 617: insulating layer, 618: insulating layer, 619: conductive layer, 621: insulating layer, 622: insulating layer, 623: insulating layer, 624: insulating layer, 625: insulating layer, 626: insulating layer, 627: conductive layer, 628: insulating layer, 631: insulating layer, 632: silicon substrate, 633: insulating layer, 634: insulating layer, 635: insulating layer, 636: conductive layer, 637: insulating layer, 638: insulating layer, 639: conductive layer, 648: insulating layer, 651: insulating layer, 652: insulating layer, 653: insulating layer, 654: insulating layer, 655: conductive layer, 661: insulating layer, 662: insulating layer, 664: insulating layer, 665: insulating layer, 671: light-blocking layer, 672: optical conversion layer, 672B: color filter, 672G: color filter, 6721R: infrared filter, 672R: color filter, 672UV: ultraviolet filter, 673: microlens array, 701: gate electrode, 702: gate insulating film, 703: source region, 704: drain region, 705: source electrode, 706: drain electrode, 707: oxide semiconductor layer, 890: automobile, 891: camera, 892: image capturing direction, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: first housing, 972: second housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:

1. An imaging device comprising:
a first transistor; and
a first pixel and a second pixel each comprising a second transistor and a capacitor,
wherein one electrode of the capacitor of the first pixel and one of a source and a drain of the second transistor of the first pixel are electrically connected to one of a source and a drain of the first transistor, and
wherein one electrode of the capacitor of the second pixel and one of a source and a drain of the second transistor of the second pixel are electrically connected to the other of the source and the drain of the first transistor.

2. The imaging device according to claim 1,
wherein the first pixel further comprises a third transistor, a fourth transistor, a fifth transistor, a sixth transistor, and a photoelectric conversion device,
wherein the other electrode of the capacitor is electrically connected to a gate of the third transistor, one of a source and a drain of the fourth transistor, and one of a source and a drain of the fifth transistor,
wherein one of a source and a drain of the third transistor is electrically connected to one of a source and a drain of the sixth transistor, and
wherein the other of the source and the drain of the fifth transistor is electrically connected to one electrode of the photoelectric conversion device.

3. The imaging device according to claim 2, wherein the photoelectric conversion device is configured to detect infrared light.

4. The imaging device according to claim 2, wherein the photoelectric conversion device comprises a compound semiconductor in a photoelectric conversion layer.

5. The imaging device according to claim 1, further comprising a first circuit,
- wherein the first circuit is configured to output a potential to the first pixel and the second pixel, and
- wherein the first circuit is electrically connected to each of the other of the source and the drain of the second transistor of the first pixel and the other of the source and the drain of the second transistor of the second pixel.

6. The imaging device according to claim 2, further comprising a second circuit,
- wherein the second circuit is a correlated double sampling circuit, and
- wherein the second circuit is electrically connected to each of the other of the source and the drain of the sixth transistor of the first pixel.

7. The imaging device according to claim 1, wherein each of the first pixel and the second pixel comprises a photoelectric conversion device.

8. The imaging device according to claim 1,
- wherein each of the first transistor and the second transistor comprises a metal oxide in a channel formation region, and
- wherein the metal oxide comprises In, Ga, and Zn.

* * * * *